United States Patent
Murayama

(10) Patent No.: US 8,598,684 B2
(45) Date of Patent: Dec. 3, 2013

(54) SEMICONDUCTOR DEVICE, AND METHOD OF MANUFACTURING THE SAME

(75) Inventor: Kei Murayama, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 512 days.

(21) Appl. No.: 12/752,736

(22) Filed: Apr. 1, 2010

(65) Prior Publication Data

US 2010/0252912 A1    Oct. 7, 2010

(30) Foreign Application Priority Data

Apr. 6, 2009  (JP) .................................. 2009-092014
May 28, 2009  (JP) .................................. 2009-128531

(51) Int. Cl.
*H01L 29/861*  (2006.01)

(52) U.S. Cl.
USPC ........................................................ 257/603

(58) Field of Classification Search
USPC ........................................................ 257/603
See application file for complete search history.

(56) References Cited

U.S. PATENT DOCUMENTS

| 7,943,473 B2 * | 5/2011 | Ellul et al. ................... 438/386 |
| 2007/0290329 A1 | 12/2007 | Murayama et al. ........... 257/704 |
| 2009/0079079 A1 * | 3/2009 | Ueda ............................. 257/758 |

FOREIGN PATENT DOCUMENTS

| JP | 2005-68494 | 3/2005 |
| JP | 2008-21987 | 1/2008 |

* cited by examiner

*Primary Examiner* — Shaun Campbell
(74) *Attorney, Agent, or Firm* — Kratz, Quintos & Hanson, LLP

(57) ABSTRACT

A method of manufacturing a semiconductor device, comprising the steps of preparing a structure including a semiconductor substrate, an element formed therein, a through hole formed to penetrate the semiconductor substrate, and an insulating layer formed on both surface sides of the semiconductor substrate and an inner surface of the through hole, and covering the element, forming a penetrating electrode in the through hole, forming a first barrier metal pattern layer covering the penetrating electrode, forming a contact hole reaching a connection portion of the element in the insulating layer, removing a natural oxide film on the connection portion of the element in the contact hole, and forming a wiring layer connected to the first barrier metal pattern layer and connected to the element through the contact hole.

6 Claims, 17 Drawing Sheets

SEMICONDUCTOR DEVICE, AND METHOD OF MANUFACTURING THE SAME

CROSS-REFERENCE TO RELATED APPLICATIONS

This application is based on and claims priority of Japanese Patent Applications No. 2009-092014 filed on Apr. 6, 2009, and No. 2009-128531 filed on May 28, 2009 the entire contents of which are incorporated herein by reference.

BACKGROUND OF THE INVENTION

1. Field of the Invention

The present invention relates to a semiconductor device and a method of manufacturing the same and, more particularly, a semiconductor device having such a structure that an element such as a diode, or the like and penetrating electrodes are formed to a semiconductor substrate and a method of manufacturing the same.

2. Description of the Related Art

In the prior art, there is the semiconductor device having such a structure that the element such as the diode, or the like and penetrating electrodes are formed to the semiconductor substrate.

In Patent Literature 1 (Patent Application Publication (KO-KAI) 2008-21987), such a semiconductor device is disclosed that the light emitting element is mounted on the upper surface side of the silicon substrate in which the Zener diode and the penetrating electrodes are formed and the wiring layers on the lower surface side of the silicon substrate are to be connected to the motherboard.

In Patent Literature 2 (Patent Application Publication (KO-KAI) 2005-68494, it is set forth that, in the thin film transistor substrate, in order to prevent the diffusion of copper into the silicon layer from the copper wirings, the barrier conductive film made of titanium nitride, or the like is arranged under the copper wirings.

As explained in the column of the related art described later, in the case that the semiconductor device in which the Zener diode and the penetrating electrodes are formed to the silicon substrate is manufactured, the contact holes whose depth reaches the connection portions of the Zener diode are formed in the insulating layer in a state that the upper and lower surfaces of the penetrating electrodes are exposed. In this state, the natural oxide film is formed on the connection portions of the Zener diode. Therefore, the natural oxide film must be removed by the wet process prior to the formation of the wiring layers.

However, when the silicon substrate is dipped in the etching tab in a state that the penetrating electrodes (copper) are exposed, the copper is diffused from the penetrating electrodes to an etchant solution in the etching tub, and thus the Zener diode is contaminated with the copper. As a result, a deterioration of the characteristics of the Zener diode is caused, which acts as the factor for reduction of a yield of the semiconductor device.

SUMMARY OF THE INVENTION

It is an object of the present invention to provide a method of manufacturing a semiconductor device and the semiconductor device, capable of preventing the element from being contaminated with copper diffused from the penetrating electrodes and being manufactured with good yield, in a method of manufacturing a semiconductor device in which an element and penetrating electrodes are formed to a semiconductor substrate.

The present invention is concerned with a method of manufacturing a semiconductor device, comprising the steps of preparing a structure including a semiconductor substrate, an element formed to the semiconductor substrate, a through hole formed to penetrate the semiconductor substrate, and an insulating layer formed on both surface sides of the semiconductor substrate and an inner surface of the through hole, and covering the element; forming a penetrating electrode in the through hole; forming a first barrier metal pattern layer covering the penetrating electrode, on both surface sides of the semiconductor substrate respectively; forming a contact hole reaching a connection portion of the element, in the insulating layer; removing a natural oxide film on the connection portion of the element in the contact hole; and forming a wiring layer connected to the first barrier metal pattern layer and connected to the connection portion of the element through the contact hole, at least on an upper surface side of the semiconductor substrate.

In the present invention, first, the structure that includes the semiconductor substrate, the element (the Zener diode, the transistor, the capacitor, or the like) formed in the semiconductor substrate, the through hole formed to penetrate the semiconductor substrate, and the insulating layer formed on both surface sides of the semiconductor substrate and the inner surface of the through hole to cover the element is prepared.

In the case that the element is the Zener diode, the Zener diode is formed by introducing the impurity whose conductivity type is an opposite conductivity type to the semiconductor substrate into the semiconductor substrate on the upper surface side or both surface sides of which the insulating layer is formed, via the insulating layer. Then, the through holes are formed in the insulating layer and the semiconductor substrate, and then the insulating layer is formed on the whole surface including the side surface of the through hole.

Then, the penetrating electrode is formed in the through hole, and then the first barrier metal pattern layer for covering the top and bottom surfaces of the penetrating electrode is formed on both surface sides of the semiconductor substrate respectively. Then, the contact hole reaching the connection portion of the element is formed in the insulating layer, and then the natural oxide film on the connection portion of the element in the contact hole is removed by the wet process.

At this time, the penetrating electrode (copper) is capped and protected with the first barrier metal pattern layer. Therefore, the copper does not diffuse into an etchant solution in the etching tub from the penetrating electrode, and thus there is no possibility that the element is contaminated with the copper.

Then, the wiring layer, which is connected to the first barrier metal pattern layer and connected to the element through the contact hole is formed.

Therefore, the element having the desired characteristics can be obtained, and the wiring layer can be connected to the element with low contact resistance. As a result, manufacturing yield of the semiconductor device can be improved.

In the semiconductor device manufactured by such manufacturing method, the wiring structure that is connected to the penetrating electrode is different from the wiring structure that is connected to the element. That is, the first barrier metal pattern layer for protecting the penetrating electrodes from the wet process intervenes between the penetrating electrode and the first wiring layer, and the element is directly connected to the wiring layer without the intervention of the first barrier metal pattern layer.

Also, the present invention is concerned with a method of manufacturing a semiconductor device, which includes the steps of preparing a structure including a semiconductor substrate, an element formed to the semiconductor substrate, a through hole formed to penetrate the semiconductor substrate, and an insulating layer formed on both surface sides of the semiconductor substrate and an inner surface of the through hole, and covering the element; forming a penetrating electrode in the through hole; forming a first barrier metal layer covering the insulating layer and the penetrating electrode, on both surface sides of the semiconductor substrate respectively; forming a contact hole reaching a connection portion of the element by processing the first barrier metal layer and the insulating layer; removing a natural oxide film on the connection portion of the element in the contact hole; and forming a first wiring layer connected to the penetrating electrode and a second wiring layer connected to the connection portion of the element through the contact hole, by utilizing the first barrier metal layer.

In the present invention, first, the structure that includes the semiconductor substrate, the element (the Zener diode, the transistor, the capacitor, or the like) formed in the semiconductor substrate, the through hole formed to penetrate the semiconductor substrate, and the insulating layer formed on both surface sides of the semiconductor substrate and the inner surface of the through hole to cover the element is prepared.

In the case that the element is formed of the Zener diode, the Zener diode is formed by introducing the impurity whose conductivity type is an opposite conductivity type to the semiconductor substrate into the semiconductor substrate on the upper surface side or both surface sides of which the insulating layer is formed, via the insulating layer. Then, the through holes are formed in the insulating layer and the semiconductor substrate, and then the insulating layer is formed on the whole surface including the side surface of the through hole.

Then, the penetrating electrode is formed in the through hole, and then the first barrier metal pattern layer for covering the upper and lower surfaces of the penetrating electrode is formed like a blanket on both surface sides of the semiconductor substrate respectively. Then, the contact hole reaching the connection portion of the element is formed by processing the first barrier metal pattern layer and the insulating layer. Then, the natural oxide film on the connection portion of the element in the contact hole is removed by the wet process.

At this time, the penetrating electrode (copper) is capped and protected with the first barrier metal pattern layer. Therefore, the copper does not diffuse into an etchant solution in the etching tub from the penetrating electrode, and thus there is no possibility that the element is contaminated with the copper.

Then, the first wiring layer connected to the penetrating electrode and the second wiring layer connected to the element through the contact hole are formed by utilizing the first barrier metal layer.

Therefore, the element having the desired characteristics can be obtained, and the wiring layer can be connected to the element with low contact resistance. As a result, manufacturing yield of the semiconductor device can be improved.

In the semiconductor device manufactured by such manufacturing method, the wiring structure that is connected to the penetrating electrode is different from the wiring structure that is connected to the element. That is, in the first wiring layer connected to the penetrating electrode, the first barrier metal pattern layer that the first barrier metal layer is patterned is connected to the penetrating electrode, and in the second wiring layer connected to the element, the first barrier metal pattern layer is formed in the portion except the contact hole, and the wiring portion on the first barrier metal pattern layer contacts the connection portion of the element and is connected thereto.

As explained above, in the present invention, such a situation can be prevented that the element is contaminated with a diffusion of copper from the penetrating electrodes in the manufacturing process.

DETAILED DESCRIPTION OF THE PREFERRED EMBODIMENTS

Embodiments of the present invention will be explained with reference to the accompanying drawings hereinafter.

(Related Art)

Prior to the explanation of embodiment of the present invention, the problem in the related art which is associated with the present invention will be explained hereunder.

FIGS. 1A to 1C and FIGS. 2A and 2B are sectional views showing a method of manufacturing a semiconductor device in the related art which is associated with the present invention.

Figure 1A:
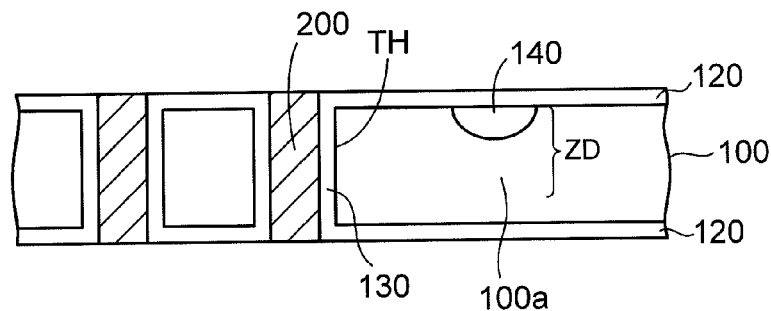
FIGS. 1A to 1C are sectional views (#1) showing a method of manufacturing a semiconductor device in the related art which is associated with the present invention.

First, steps until a sectional structure in FIG. 1A is obtained will be explained hereunder. As shown in FIG. 1A, an insulating layer 120 is formed on both surface sides of a p-type silicon substrate 100 by the thermal oxidation. Then, an n-type impurity diffusion region 140 is formed by implanting ions into the silicon substrate 100 via the insulating layer 120 while using a resist (not shown) as a mask. Accordingly, a Zener diode ZD is constructed by the n-type impurity diffusion region 140 and a p-type silicon portion 100a.

Then, through holes TH are formed to penetrate the insulating layers 120 on both surface sides and the silicon substrate 100 in their thickness direction. Then, an insulating layer 130 is formed on side surfaces of the through holes TH by thermally oxidizing the silicon substrate 100. Then, a penetrating electrode 200 made of copper is filled in the through holes TH by the plating method.

Figure 1B:
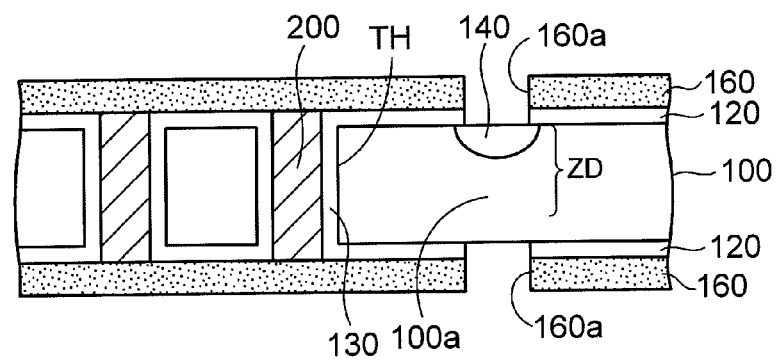

Then, as shown in FIG. 1B, a resist 160 in which an opening portion 160a is provided to a portion corresponding to the Zener diode ZD is formed on the insulating layers 120 on both surface sides of the silicon substrate 100 respectively.

Then, the insulating layers 120 is etched through the opening portion 160a of the resist 160 on both surface sides of the silicon substrate 100, while using the resist 160 as a mask. Then, the resist 160 is removed.

Figure 1C:
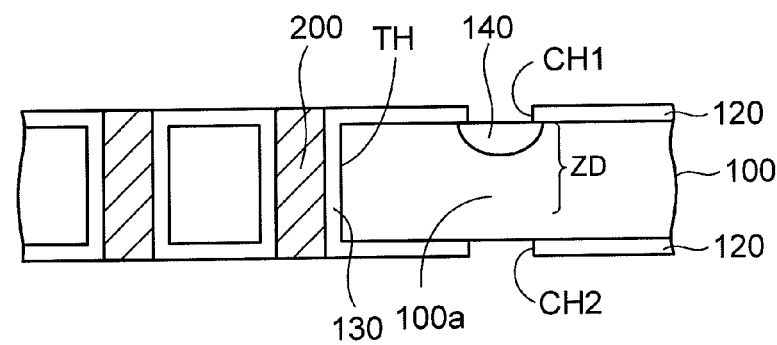

Accordingly, as shown in FIG. 1C, in the upper surface side of the silicon substrate 100a, a contact hole CH1 which reaches the n-type impurity diffusion region 140 of the Zener diode ZD is formed in the insulating layers 120. Also, in the lower surface side of the silicon substrate 100a, a contact hole CH2 which reaches a lower surface of the p-type silicon portion 100a of the Zener diode ZD is formed in the insulating layers 120.

At this time, the n-type impurity diffusion region 140 and the lower surface of the p-type silicon portion 100a, which are exposed in the contact holes CH1, CH2 respectively, of the Zener diode ZD are exposed to an atmosphere, so that an ultrathin natural oxide film ($SiO_2$) is formed thereon. Alternatively, in the case that the resist 160 is removed by the dry ashing using oxygen, an oxide film which is thicker than the natural oxide film may be formed in some cases.

In the situation that the natural oxide film is formed on the n-type impurity diffusion region 140 and the lower surface of the p-type silicon portion 100a in the contact holes CH1, CH2, a contact resistance is increased when the wiring layers connected to the Zener diode ZD are formed. Therefore, the characteristics of the Zener diode ZD cannot be sufficiently brought out. For this reason, these natural oxide films must be removed as the prior process in forming the wiring layers.

Figure 2A:
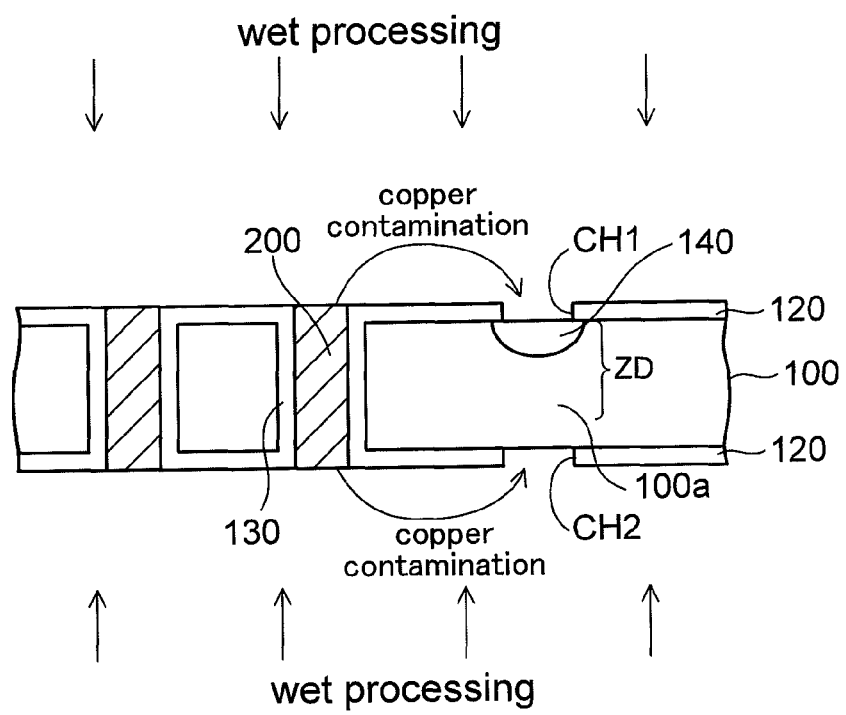
FIGS. 2A and 2B are sectional views (#2) showing the method of manufacturing the semiconductor device in the related art which is associated with the present invention.

As the method of removing the natural oxide film, as shown in FIG. 2A, the method of applying the wet etching (light etching) by dipping the silicon substrate 100 in the etching tub (not shown), in which an etchant solution such as dilute HF, or the like is filled, is employed.

At this time, the upper and lower surfaces of the penetrating electrodes 200 are exposed to both surface sides of the silicon substrate 100. Therefore, the copper diffuses into an etchant solution in the etching tub from the penetrating electrodes 200, and the copper adheres to the silicon substrate 100 which is exposed from the contact holes CH1, CH2. That is, the silicon substrate 100 is contaminated with the copper.

Figure 2B:
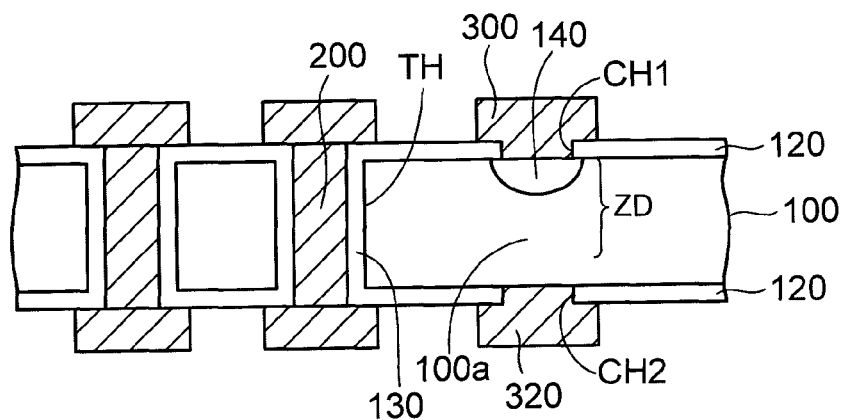

Then, as shown in FIG. 2B, a wiring layer 300 connected to the penetrating electrode 200 and connected to the n-type impurity diffusion region 140 of the Zener diode ZD through the contact hole CH1 is formed on the insulating layer 120 on the upper surface side of the silicon substrate 100.

Also, a wiring layer 320 connected to the penetrating electrode 200 and connected to the lower surface of the p-type silicon portion 100a of the Zener diode ZD through the contact hole CH2 is formed on the insulating layer 120 on the lower surface side of the silicon substrate 100.

The wiring layers 300 connected to the n-type impurity diffusion region 140 acts as a minus (−) electrode, and the wiring layers 320 connected to the lower surface of the p-type silicon portion 100a acts as a plus (+) electrode. Thus, the rectifying characteristic of the Zener diode ZD is obtained.

As described above, the silicon substrate 100 is contaminated with the copper, and the copper has the property that it diffuses easily in the silicon. Therefore, the characteristics of the Zener diode ZD are deteriorated, which acts as the causes of reducing the yield.

The methods of manufacturing the semiconductor device of the present embodiments explained hereinafter can solve the above-mentioned disadvantages.

(First Embodiment)

FIGS. 3A to 3D, FIGS. 4A to 4D, FIGS. 5A to 5C, and FIGS. 6A and 6B are sectional views showing a method of manufacturing a semiconductor device according to a first embodiment of the present invention.

Figure 3A:
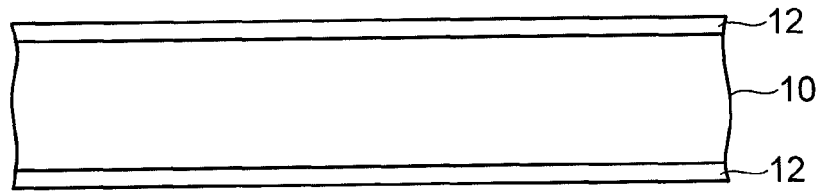
FIGS. 3A to 3D are sectional views (#1) showing a method of manufacturing a semiconductor device according to a first embodiment of the present invention.

In the method of manufacturing the semiconductor device according to the first embodiment, as shown in FIG. 3A, first, a p-type silicon substrate 10 (semiconductor substrate) is prepared, and then an insulating layer 12 made of a silicon oxide layer is formed on both surface sides by the thermal oxidation. The insulating layer 12 made of the silicon oxide layer, or the like may be formed only on the upper surface side of the silicon substrate 10 by the CVD method.

Figure 3B:
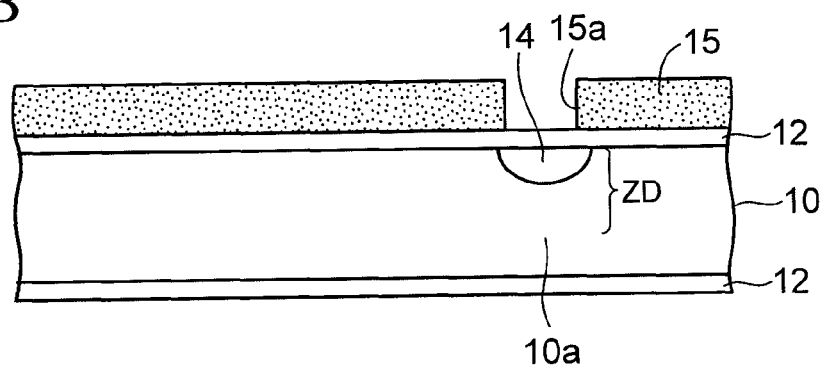

Then, as shown in FIG. 3B, a resist 15 in which an opening portion 15a is provided is formed on the insulating layer 12 on the upper surface side of the silicon substrate 10 by the photolithography. Then, an n-type conductivity impurity such as antimony, arsenic, phosphorus, or the like is ion-implanted into the silicon substrate 10 from the opening portion 15a of the resist 15 through the insulating layer 12 while using the resist 15 as a mask.

Accordingly, an n-type impurity diffusion region 14 is formed in the surface layer portion of the silicon substrate 10. In this manner, a Zener diode ZD (element) is constructed by the n-type impurity diffusion region 14 and a p-type silicon portion 10a. Then, the resist 15 is removed.

In this case, the Zener diode ZD may be constructed by ion-implanting a p-type conductivity impurity into an n-type silicon substrate. That is, a conductivity impurity with opposite conductivity type to that of the silicon substrate may be introduced into the silicon substrate.

In this manner, the Zener diode ZD (element) is formed in the silicon substrate 10 in a state that this diode is covered with the insulating layer 12.

Figure 3C:
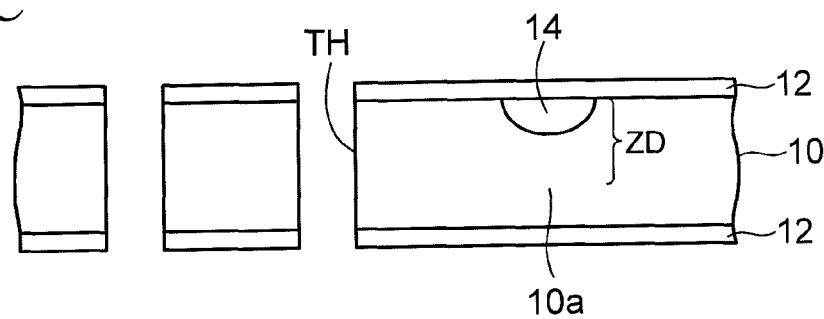

Then, as shown in FIG. 3C, a mask (not shown) made of a resist and the like, in which opening portions are provided, is formed on the upper surface side of the silicon substrate 10.

Then, the insulating layer 12 on the upper surface side, the silicon substrate 10 and the insulating layer 12 on the lower surface side are penetration-processed by the dry etching. Then, the mask is removed. Accordingly, through holes TH are formed in the insulating layer 12 on both surface sides and the silicon substrate 10 to penetrate them in their thickness direction.

Figure 3D:
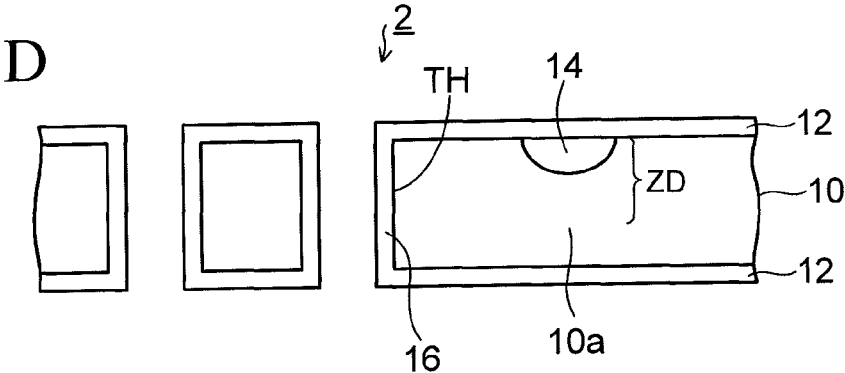

Then, as shown in FIG. 3D, an insulating layer 16 made of a silicon oxide layer is formed on inner surfaces of the through holes TH by thermally oxidizing the silicon substrate 10. In above-mentioned FIG. 3A, in that case that the insulating layer 12 is not formed on the lower surface of the silicon substrate 10, the insulating layer 16 is formed simultaneously on the inner surfaces of the through holes TH and the lower surface of the silicon substrate 10 by the thermal oxidation.

Alternatively, the silicon oxide layer may be formed on both surface sides of the silicon substrate 10 and the inner surfaces of the through holes TH by the CVD method, and thus the insulating layer 16 may be obtained.

In this manner, a structure 2 including the silicon substrate 10, the Zener diode ZD formed therein, the through holes TH which penetrate the silicon substrate 10, and the insulating layers 12, formed on both surface sides of the silicon substrate 10 and the inner surfaces of the through holes TH to cover the Zener diode ZD is obtained.

Figure 4A:
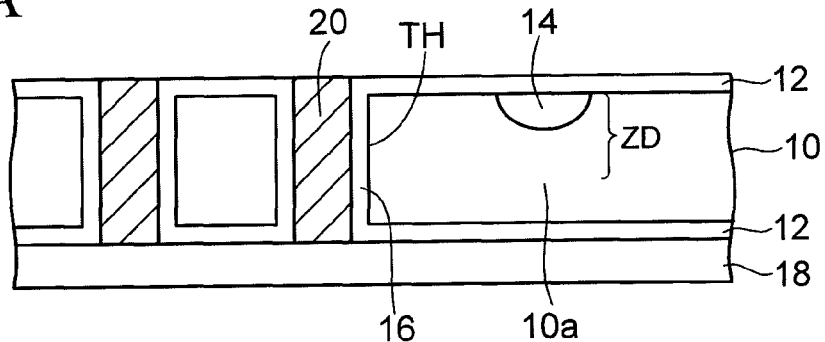
FIGS. 4A to 4D are sectional views (#2) showing the method of manufacturing the semiconductor device according to the first embodiment of the present invention.

Then, as shown in FIG. 4A, a plating power feeding member 18 made of a copper foil, or the like is arranged under the silicon substrate 10. Then, the copper plating is applied to insides of the through holes TH from the top portion to the bottom portion by the electroplating utilizing the plating power feeding member 18 as a plating power feeding path. Thus, a penetrating electrode 20 is formed to be filled in the insides of the through holes TH. Then, the plating power feeding member 18 is removed from the silicon substrate 10.

In the case that the penetrating electrode 20 is formed on the through hole TH to protrude from there, the top portions of the penetrating electrodes 20 are polished by the CMP, or the like. Accordingly, the upper surfaces of the penetrating electrodes 20 and the upper surface of the insulating layer 12 constitute the identical surface and are planarized.

Figure 4B:
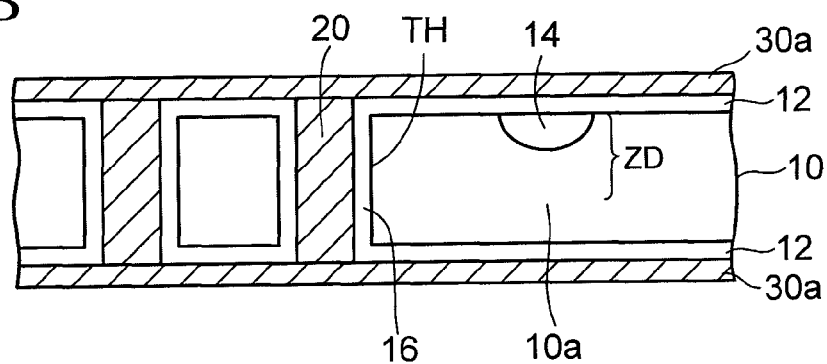

Then, as shown in FIG. 4B, a barrier metal layer 30a is formed on the insulating layer 12 on both surface sides of the silicon substrate 10 by the sputter method respectively. As the barrier metal layer 30a, a titanium (Ti) layer whose thickness is 100 nm is used. Alternatively, the barrier metal layer 30a may be constructed by forming a titanium nitride (TiN) layer on the Ti layer. Otherwise, the barrier metal layer 30a may be formed of an aluminum (Al) layer or an aluminum alloy layer.

Figure 4C:
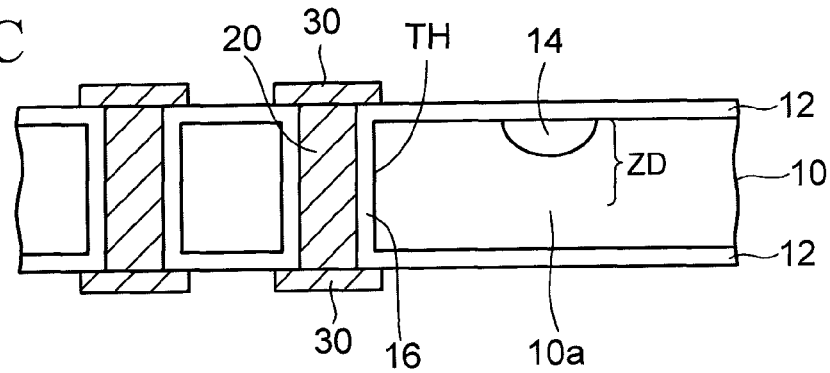

Then, as shown in FIG. 4C, the barrier metal layer 30a is patterned on both surface sides of the silicon substrate 10 by the photolithography and the etching. Thus, first barrier metal pattern layers 30 connected to the upper and lower surfaces of the penetrating electrodes 20 respectively are formed. Accordingly, the upper and lower surfaces of the penetrating electrodes 20 are covered with the first barrier metal pattern layer 30 respectively.

The first barrier metal pattern layer 30 may cover the penetrating electrode 20 as an island-like electrode, or may extend like a wiring from the penetrating electrode 20 to the outer side.

As described later, the first barrier metal pattern layer 30 functions as a copper diffusion preventing layer that prevents such a situation that the copper diffuses into an etchant solution from the penetrating electrode 20 while the wet process is applied to the silicon substrate 10.

Figure 4D:
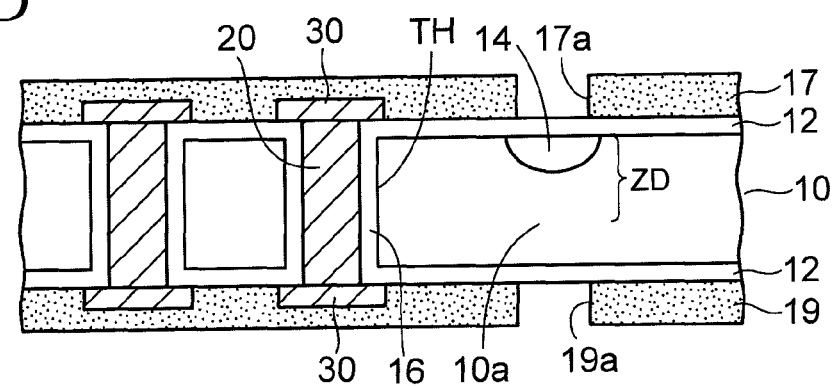

Then, as shown in FIG. 4D, a resist 17 in which an opening portion 17a is provided on the n-type impurity diffusion region 14 of the Zener diode ZD is formed on the insulating layer 12 on the upper surface side of the silicon substrate 10.

Then, a resist 19 in which an opening portion 19a is provided in the portion corresponding to the Zener diode ZD is formed on the insulating layer 12 on the lower surface side of the silicon substrate 10.

Then, the insulating layer 12 on both surface sides of the silicon substrate 10 is etched through the opening portions 17a, 19a while using the resists 17, 19 as a mask. Then, the resists 17, 19 are removed.

Figure 5A:
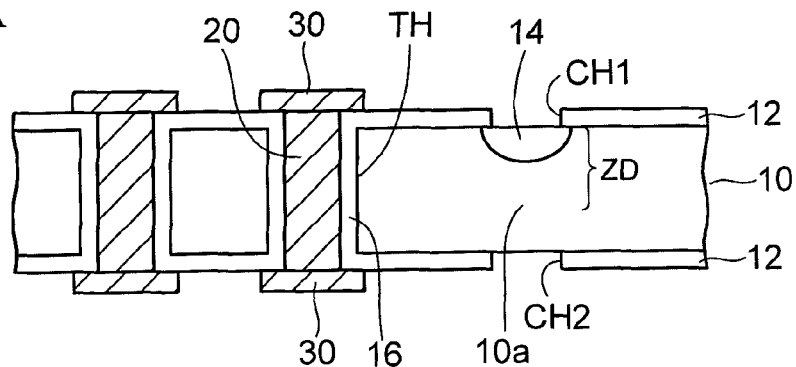
FIGS. 5A to 5C are sectional views (#3) showing the method of manufacturing the semiconductor device according to the first embodiment of the present invention.

Accordingly, as shown in FIG. 5A, a contact hole CH1 which reaches the n-type impurity diffusion region 14 (connection portion) of the Zener diode ZD is formed in the insulating layer 12 on the upper surface side of the silicon substrate 10. Also, a contact hole CH2 which reaches the lower surface (connection portion) of the p-type silicon portion 10a of the Zener diode ZD is formed in the insulating layer 12 on the lower surface side of the silicon substrate 10.

At this time, like the above related art, the n-type impurity diffusion region 14 and the lower surface of the p-type silicon portion 10a, which are exposed into the contact holes CH1, CH2 respectively, of the Zener diode ZD are exposed to an atmosphere. Thus, a natural oxide film ($SiO_2$) is formed thereon.

Then, the silicon substrate 10 is dipped in the etching tub (not shown) in which an etchant solution such as dilute HF, or the like is filled. Thus, the natural oxide film formed on the n-type impurity diffusion region 14 and the lower surface of the p-type silicon portion 10a in the contact holes CH1, CH2 is removed.

At this time, the upper and lower surfaces of the penetrating electrodes 20 are capped and protected by the first barrier metal pattern layer 30. Therefore, there is no fear that the copper diffuses into an etchant solution in the etching tub from the penetrating electrodes 20. Therefore, the Zener diode ZD exposed into the contact holes CH1, CH2 is not contaminated with the copper, and as a result, the Zener diode ZD having the desired characteristics can be obtained.

Also, the natural oxide film is removed from the connection portion of the Zener diode ZD. Therefore, the wiring layer described later can be connected to the Zener diode ZD with low contact resistance and with good reliability.

Figure 5B:
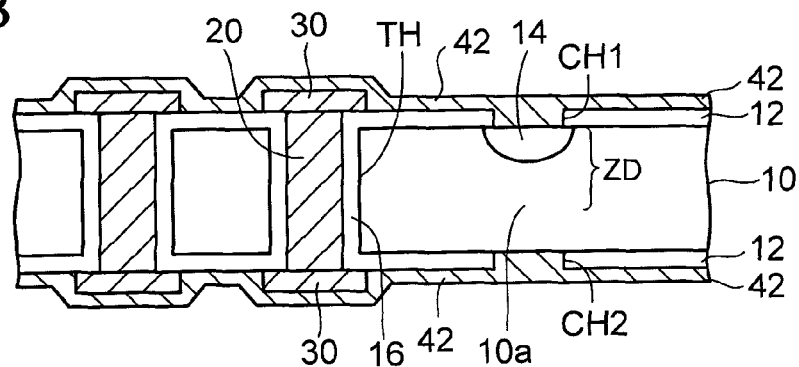

Then, as shown in FIG. 5B, a seed layer 42 is formed on both surface sides of the silicon substrate 10 by the sputter method. As the seed layer 42, the metal material that can function as not only the plating power feeding path of the electroplating but also the barrier metal layer is employed.

For example, the seed layer 42 is formed of a Ti layer (film thickness: 50 nm)/a Cu layer (film thickness: 300 nm) in order from the bottom. Otherwise, the seed layer 42 may be formed of a Ti layer/a TiN layer, or a Ti layer/a TiN layer/a Cu layer in order from the bottom.

Figure 5C:
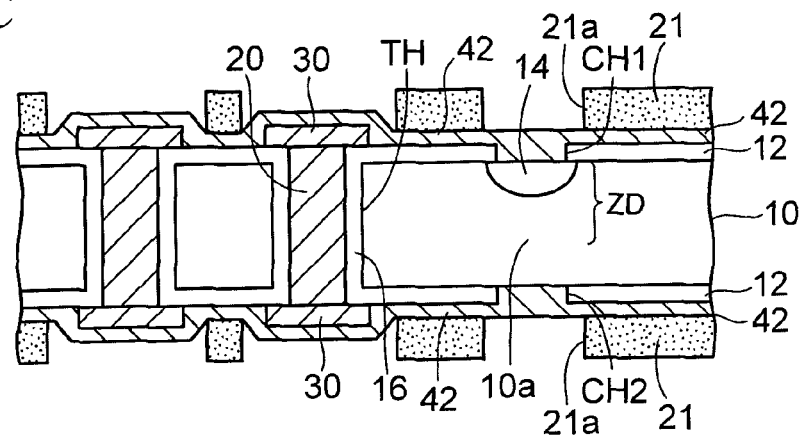

Then, as shown in FIG. 5C, a plating resist 21 in which an opening portion 21a is provided on the portion where the wiring layer is arranged is formed on the seed layer 42 on both surface sides of the silicon substrate 10 respectively.

Figure 6A:
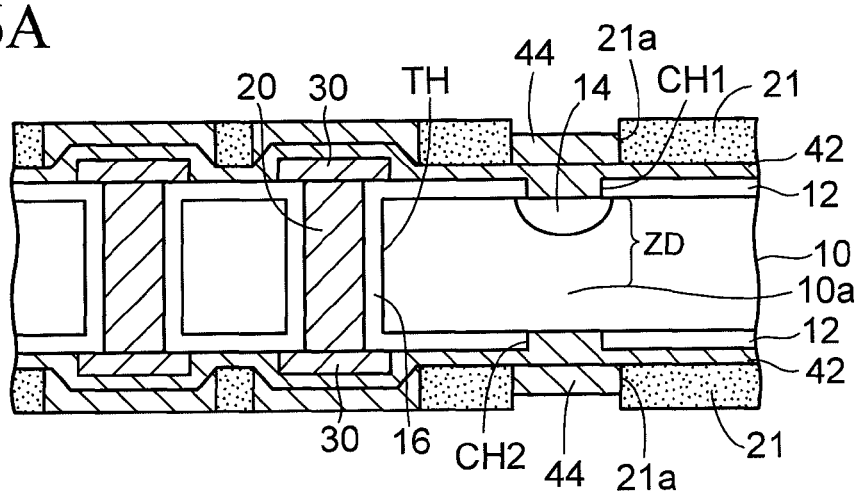
FIGS. 6A and 6B are sectional views (#4) showing the method of manufacturing the semiconductor device according to the first embodiment of the present invention.

Then, as shown in FIG. 6A, a conductive pattern layer 44 is formed in the opening portion 21a of the plating resist 21 on both surface sides of the silicon substrate 10 by the electroplating utilizing the seed layer 42 as a plating power feeding path. For example, the conductive pattern layer 44 is constructed by a Cu layer (film thickness: 500 nm)/a Ni layer (film thickness: 300 nm)/an Au layer (film thickness: 100 nm) in order from the bottom.

Figure 6B:
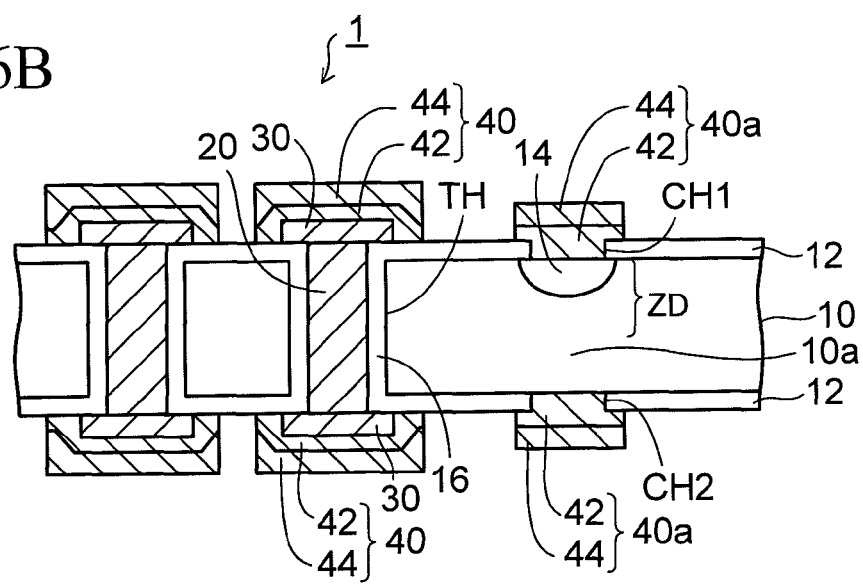

Then, as shown in FIG. 6B, the plating resist 21 is removed from both surface sides of the silicon substrate 10, and then the seed layer 42 is etched by using the conductive pattern layer 44 as a mask. Accordingly, first wiring layers 40 each constructed by the seed layer 42 and the conductive pattern layer 44 and connected to the first barrier metal pattern layer 30 are formed on both surface sides of the silicon substrate 10 respectively.

Also, a second wiring layer 40a constructed by the seed layer 42 and the conductive pattern layer is formed on both surface sides of the silicon substrate 10 respectively. The second wiring layer 40a is connected to the n-type impurity diffusion region 14 and the p-type silicon portion 10a of the Zener diode ZD through the contact holes CH1, CH2 respectively. In the first and second wiring layers 40, 40a, the seed layer 42 functions as a second barrier metal pattern layer, and the conductive pattern layer 44 functions as a wiring portion.

With the above, a semiconductor device 1 of the first embodiment can be obtained.

As shown in FIG. 6B, in the semiconductor device 1 of the first embodiment, the insulating layer 12 is formed on both surface sides of the p-type silicon substrate 10 respectively. The n-type impurity diffusion region 14 is formed to the surface layer portion of the silicon substrate 10, so that the Zener diode ZD (element) is constructed by the n-type impurity diffusion region 14 and the p-type silicon portion 10a.

The through holes TH are formed in the silicon substrate 10 to penetrate in the thickness direction, and the insulating layer 16 is formed on both surface sides of the silicon substrate 10 and the inner surfaces of the through holes TH. The penetrating electrode 20 made of the copper is formed to be filled in the through holes TH.

Also, the first barrier metal pattern layer 30 for covering the upper and lower surfaces of the penetrating electrodes 20 is formed on both surface sides of the silicon substrate 10. The first wiring layer 40 connected to the first barrier metal pattern layer 30 is formed on the insulating layer 12 on both surface sides of the silicon substrate 10 respectively.

Also, the contact hole CH1 which reaches the n-type impurity diffusion region 14 (connection portion) and the lower surface (connection portion) of the p-type silicon portion 10a of the Zener diode ZD is formed in the insulating layer 12 on both surface sides of the silicon substrate 10 respectively.

Then, the second wiring layers 40a connected to the n-type impurity diffusion region 14 through the contact hole CH1 is formed on the insulating layer on the upper surface side of the silicon substrate 10. Also, the second wiring layers 40a connected to the lower surface of the p-type silicon portion 10a of the Zener diode ZD through the contact hole CH2 is formed on the insulating layer on the lower surface side of the silicon substrate 10.

The first and second wiring layers 40, 40a are constructed by the seed layer 42 functioning as a second barrier metal pattern layer and the conductive pattern layer 44 formed thereon, respectively. That is, the first and second wiring layers 40, 40a are formed to contain the second barrier metal pattern layer (the seed layer 42) at the lowermost part. As a result, it can be prevented that the copper contained in the conductive pattern layer 44 of the second wiring layers 40a diffuses into the Zener diode ZD.

Also, the first wiring layers 40 connected to the first barrier metal pattern layer 30 and the second wiring layers 40a connected to the Zener diode ZD are formed from the identical layer, on both surface sides of the silicon substrate 10.

As described above, in the method of manufacturing the semiconductor device 1 of the first embodiment, after the penetrating electrodes 20 are covered with the first barrier metal pattern layer 30, the contact holes CH1, CH2 that cause the n-type impurity diffusion region 14 of the Zener diode ZD and the p-type silicon portion 10a to expose are formed in the insulating layer 12.

Then, as the preprocessing when forming the first and second wiring layers 40, 40a, the natural oxide film formed on the n-type impurity diffusion region 14 and the lower surface of the p-type silicon portion 10a of the Zener diode ZD is removed.

At this time, the penetrating electrodes 20 are capped and protected with the first barrier metal pattern layer 30. Therefore, the copper of the penetrating electrodes 20 does not diffuse into an etchant solution during the wet process, and thus there is no fear that the Zener diode ZD is contaminated with the copper. Then, the first and second wiring layers 40, 40a connected to the penetrating electrodes 20 and the Zener diode ZD are formed simultaneously.

The semiconductor device 1 of the first embodiment is manufactured by such manufacturing method. Therefore, the wiring structure connected to the penetrating electrodes 20 is different from the wiring structure connected to the Zener diode ZD.

That is, the first barrier metal pattern layer 30 for protecting the penetrating electrodes 20 from the wet process intervenes between the penetrating electrodes 20 and the first wiring layers 40. The Zener diode ZD is directly connected to the second wiring layers 40a without the intervention of the first barrier metal pattern layer 30.

In this manner, in the semiconductor device 1 of the first embodiment, there is no fear that the Zener diode ZD formed in the silicon substrate 10 suffers the contamination of copper from the penetrating electrodes 20 during the manufacturing process. As a result, the Zener diode ZD having the desired characteristics can be obtained, and the semiconductor device can be manufactured with good yield.

In the semiconductor device 1 of the first embodiment, the second wiring layers 40a connected to the n-type impurity diffusion region 14 acts as a minus (−) electrode, and the second wiring layers 40a connected to the lower surface of the p-type silicon portion 10a acts as a plus (+) electrode. Thus, the rectifying characteristic of the Zener diode ZD is obtained.

Then, the light emitting element (not shown) such as LED, or the like is mounted to be connected to the first and second wiring layers 40, 40a, and the Zener diode ZD is connected electrically in parallel with the light emitting element in the power line and acts as the power regulator. Then, the first and second wiring layers 40, 40a on the lower surface side of the silicon substrate 10 are connected to the wiring substrate (motherboard).

In the example of the semiconductor device 1 in FIG. 6B, the lower surface of the p-type silicon portion 10a of the p-type silicon portion 10a is used as the connection portion. In this case, the upper surface of the p-type silicon portion 10a on the outside of the n-type impurity diffusion region may be used as the connection portion, and the contact hole reaching the upper surface of the p-type silicon portion 10a may be formed in the insulating layer 12 on the upper surface side.

Also, in the case that the contact hole for the element is not formed on the lower surface, there is no necessity that the first and second wiring layers 40, 40a should always be formed on the lower surface side. The connection electrode may be provided to the first barrier metal pattern layer 30 on the lower surface side.

Also, in the case that a plurality of semiconductor devices 1 are obtained from the silicon substrate 10, the silicon substrate 10 is cut before or after the light emitting element is mounted.

(Second Embodiment)

FIGS. 7A to 7C, FIGS. 8A to 8C, and FIGS. 9A to 9C are sectional views showing a method of manufacturing a semiconductor device according to a second embodiment of the present invention. In the second embodiment, a transistor is formed to the silicon substrate instead of the Zener diode.

In the second embodiment, the detail explanation of the same steps as those in the first embodiment will be omitted herein.

Figure 7A:
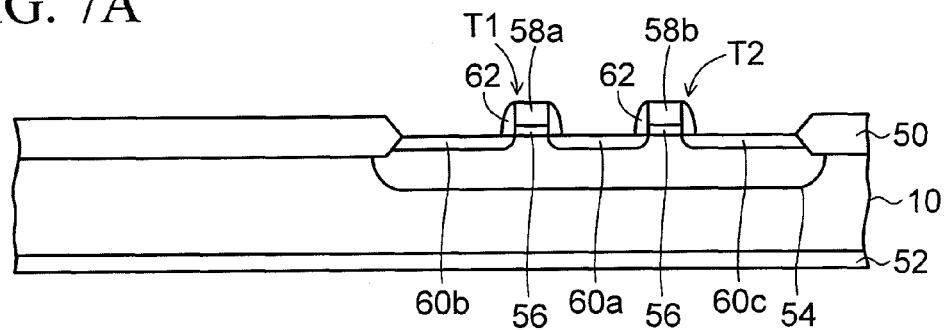
FIGS. 7A to 7C are sectional views (#1) showing a method of manufacturing a semiconductor device according to a second embodiment of the present invention.

First, steps until a sectional structure in FIG. 7A is obtained will be explained hereunder. As shown in FIG. 7A, an element isolation insulating layer 50 made of a silicon oxide layer is formed around a transistor forming region in the n-type or p-type silicon substrate 10 (semiconductor substrate). The element isolation insulating layer is formed by oxidizing selectively the silicon substrate 10 while using the silicon nitride layer (SiN) as a mask. Otherwise, an element isolation groove may be formed in the silicon substrate 10, and then the insulating layer may be buried therein.

Then, an insulating layer 52 made of a silicon oxide layer is formed on the lower surface side of the silicon substrate 10. The insulating layer 52 may be formed simultaneously with the element isolation insulating layer 50. Alternatively, the insulating layer 52 on the lower surface side of the silicon substrate 10 may be formed by the later step.

Then, a p-well 54 is formed by introducing a p-type impurity into the transistor forming region of the silicon substrate 10. Then, gate insulating films 56 made of a silicon oxide layer are formed by thermally oxidizing the surface of the transistor forming region of the silicon substrate 10.

Then, an amorphous silicon layer or a polysilicon layer is formed on the whole upper surface of the silicon substrate 10. Then, gate electrodes 58a, 58b are formed by patterning this silicon layer by means of the photolithography and the dry etching.

Then, first to third n-type impurity diffusion regions 60a, 60b, 60c acting as source/drain regions are formed by ion-implanting an n-type impurity into both sides of the gate electrodes 58a, 58b in the p-well 54.

Then, an insulating layer such as a silicon oxide layer, or the like is formed on the whole surface of the silicon substrate 10 by the CVD method. Then, a sidewall spacer 62 having insulating property is left on both side portions of the gate electrodes 58a, 58b respectively by etching back the insulating layer.

Then, the n-type impurity is ion-implanted into the first to third n-type impurity diffusion regions 60a, 60b, 60c again while using the gate electrodes 58a, 58b and the sidewall spacers 62 as a mask. Thus, the first to third n-type impurity diffusion regions 60a, 60b, 60c are made an LDD (Lightly Doped Drain) structure.

According to the above steps, two n-channel type MOS transistors T1, T2 (the elements) having the n-type impurity diffusion regions 60a, 60b, 60c of the LDD structure, the gate insulating film 56, and the gate electrodes 58a, 58b is formed in the p-well 54 respectively.

In this case, although not particularly shown, an n-well is formed in the silicon substrate 10, and p-channel type MOS transistors (the elements) are formed in the n-well region.

Figure 7B:
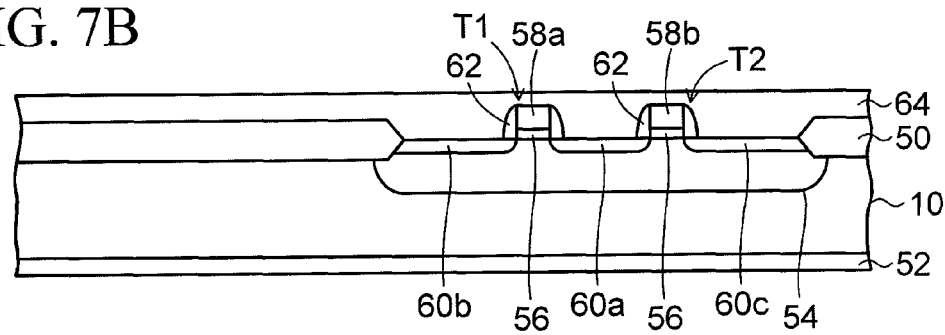

Then, as shown in FIG. 7B, a silicon oxide layer is formed on the MOS transistors T1, T2 as an interlayer insulating layer 64 by the CVD method. Then, an upper surface of the interlayer insulating layer 64 is planarized by the CMP. Accordingly, such a situation is obtained that the MOS transistors T1, T2 formed to the silicon substrate 10 are covered with the interlayer insulating layer 64.

Then, a mask (not shown) in which opening portions are provided and which made of a resist, or the like is formed on the interlayer insulating layer 64. Then, the interlayer insulating layer 64, the element isolation insulating layer 50, the silicon substrate 10, and insulating layer 52 under it are penetration-processed by the dry etching through the opening portions of the mask. Then, the mask is removed.

Figure 7C:
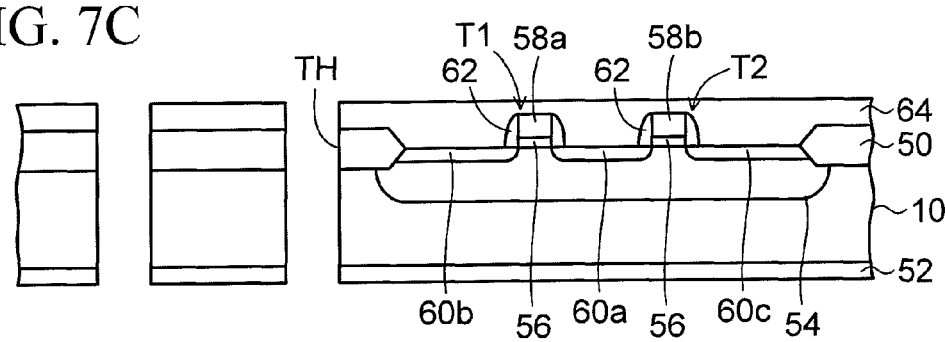

As a result, as shown in FIG. 7C, the through holes TH are formed in the interlayer insulating layer 64, the element isolation insulating layer 50, the silicon substrate 10, and the insulating layer 52 to penetrate them in the thickness direction.

Figure 8A:
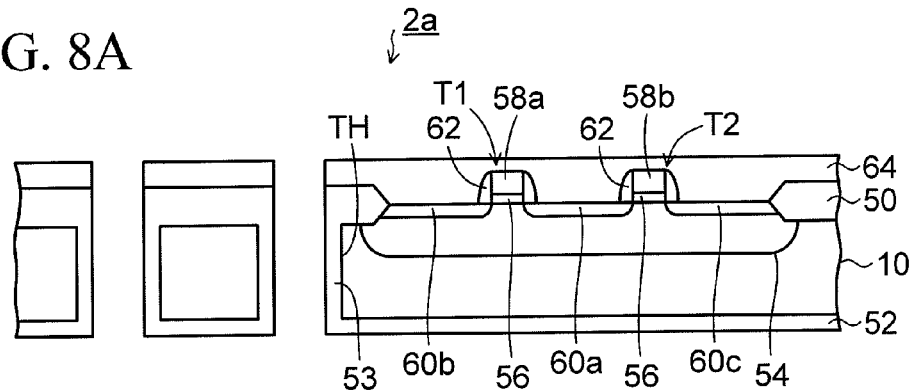
FIGS. 8A to 8C are sectional views (#2) showing the method of manufacturing the semiconductor device according to the second embodiment of the present invention.

Then, as shown in FIG. 8A, an insulating layer is formed on the inner surfaces of the through holes TH by thermally oxidizing the silicon substrate 10. In this case, when the heating process applied to the thermal oxidation influences the characteristics of the MOS transistors T1, T2, the insulating layer 53 may be formed on the inner surfaces of the through holes TH and both surface sides of the silicon substrate 10 by the CVD method. Also, in the case that the insulating layer 52 is not formed on the lower surface of the silicon substrate 10 in above FIG. 7A, the insulating layer 52 is formed simultaneously on the inner surfaces of the through holes TH and the lower surface of the silicon substrate 10.

In this manner, a structure 2a including the silicon substrate 10, the MOS transistors T1, T2 formed thereon, the through holes TH penetrating the silicon substrate 10, and the insulating layer (the interlayer insulating layer 64, the insulating layers 52, 53) formed on both surface sides of the silicon substrate 10 and the inner surfaces of the through holes TH to cover the MOS transistors T1, T2 is obtained.

Figure 8B:
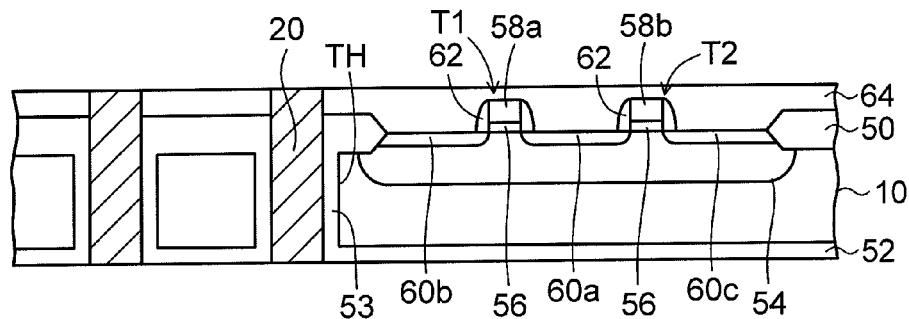

Then, as shown in FIG. 8B, the penetrating electrode 20 made of copper is formed in the through holes TH of the silicon substrate 10 respectively by the electroplating similar to that in the first embodiment.

Figure 8C:
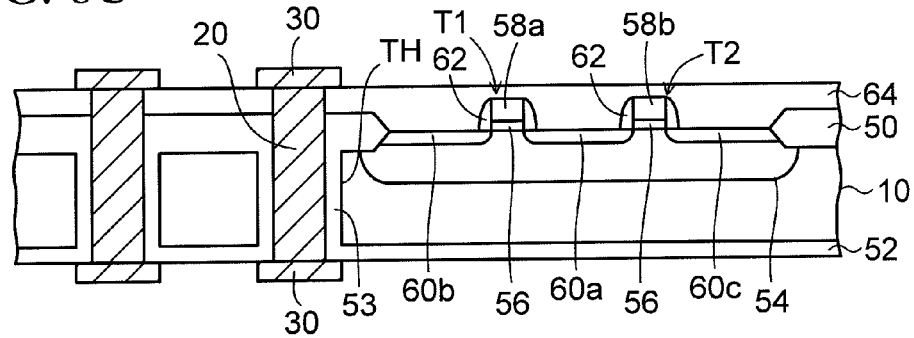

Then, as shown in FIG. 8C, the first barrier metal pattern layer 30 for covering the upper and lower surfaces of the penetrating electrodes 20 is formed on both surface sides of the silicon substrate 10 respectively by the method explained in FIGS. 4A to 4C in the first embodiment.

Figure 9A:
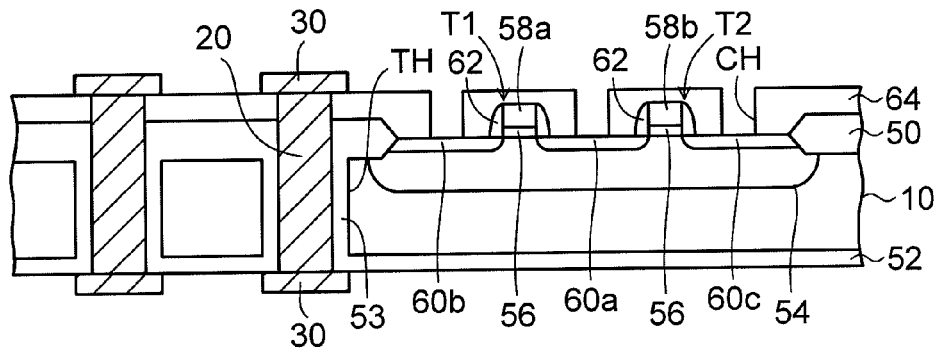
FIGS. 9A to 9C are sectional views (#3) showing the method of manufacturing the semiconductor device according to the second embodiment of the present invention.

Then, as shown in FIG. 9A, the interlayer insulating layer 64 is patterned by the photolithography and the dry etching. Thus, contact holes CH reaching the first to third n-type impurity diffusion regions 60a, 60b, 60c are formed in the interlayer insulating layer 64.

In the second embodiment, in this state, the natural oxide film is formed to the surfaces of the first to third n-type impurity diffusion regions 60a, 60b, 60c exposed in the contact holes CH. Therefore, the natural oxide film in the contact holes CH is removed by the wet process similar to the first embodiment.

At this time, like the first embodiment, the penetrating electrodes 20 are capped and protected with the first barrier metal pattern layer 30. Therefore, there is no fear that the copper of the penetrating electrodes 20 enters into the first to third n-type impurity diffusion regions 60a, 60b, 60c in the contact holes CH during the wet process. As a result, a deterioration of the characteristics of the MOS transistors T1, T2 can be prevented, and the desired transistor characteristics can be obtained.

Also, the natural oxide film in the connection portions of the MOS transistors T1, T2 is removed. Therefore, the wiring layers described later are connected to the MOS transistors T1, T2 with low contact resistance and with good reliability.

Figure 9B:
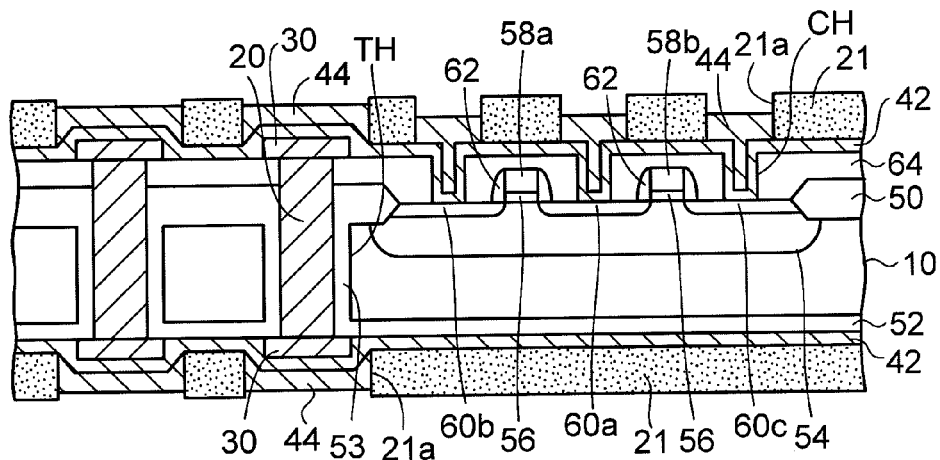

Then, as shown in FIG. 9B, the seed layer 42 is formed on the interlayer insulating layer 64 and the inner surfaces of the contact holes CH on the upper surface side of the silicon substrate 10. Also, the seed layer 42 is formed on the insulating layer 52 and the first barrier metal pattern layer 30 on the lower surface side of the silicon substrate 10. As the seed layer 42, the metal material acting as the barrier metal layer is employed, like the first embodiment.

Then, like the first embodiment, the plating resist 21 in which the opening portion 21a is provided in the portions where the wiring layers are arranged is formed on both surface sides of the silicon substrate 10 respectively. Then, the conductive pattern layer 44 is formed in the opening portions 21a of the plating resist 21 respectively by the electroplating utilizing the seed layer 42 as the plating power feeding path. The conductive pattern layer 44 is formed to be filled in the contact holes CH.

Then, the plating resist 21 is removed from both surface sides of the silicon substrate 10, and then the seed layer 42 is etched while using the conductive pattern layer 44 as a mask.

Figure 9C:
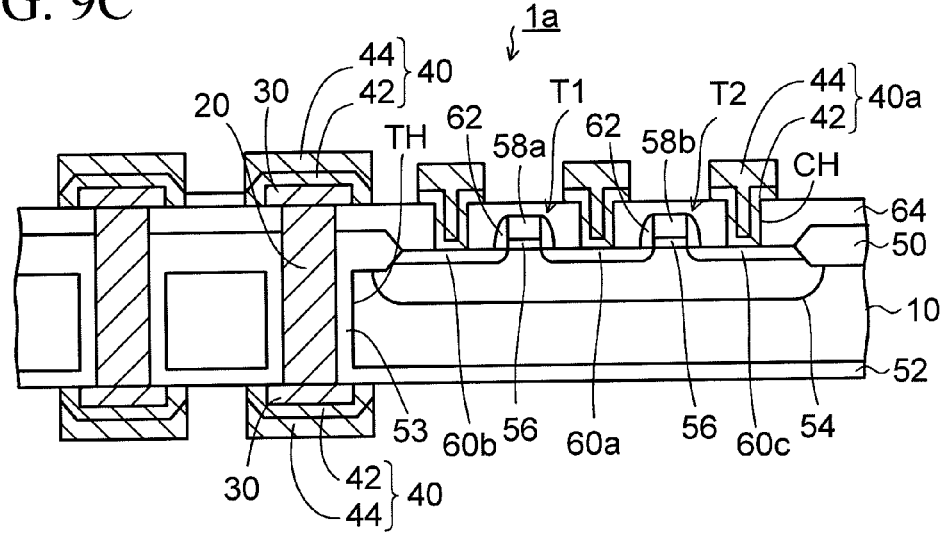

Accordingly, as shown in FIG. 9C, the first wiring layers 40 connected to the first barrier metal pattern layer 30 and the second wiring layers 40a connected to the n-type impurity diffusion regions 60a, 60b, 60c of the MOS transistors T1, T2 via the contact hole CH1 are formed on the interlayer insulating layer 64 on the upper surface side of the silicon substrate 10.

Also, simultaneously the first wiring layers 40 connected to the first barrier metal pattern layer 30 is formed on the insulating layer 52 on the lower surface side of the silicon substrate 10.

With the above, a semiconductor device 1a of the second embodiment is obtained.

As shown in FIG. 9C, in the semiconductor device 1a of the second embodiment, the element isolation insulating layer 50 is formed on the upper surface side of the silicon substrate 10 to surround the transistor forming region. The MOS transistors T1, T2 (the elements) are formed in the transistor forming region.

The interlayer insulating layer 64 is formed on the element isolation insulating layer 50 and the MOS transistors T1, T2. Also, the insulating layer is formed on the lower surface side of the silicon substrate 10.

The through holes TH are formed in the interlayer insulating layer 64, the silicon substrate 10, and the insulating layer 52 to penetrate them in the thickness direction. Then, the insulating layer 53 is formed on the inner surfaces of the through holes TH.

The penetrating electrode 20 made of copper is formed in the through holes TH respectively. Then, the first barrier metal pattern layer 30 for covering the penetrating electrodes 20 is formed on both surface sides of the silicon substrate 10 respectively.

The first wiring layers 40 connected to the first barrier metal pattern layer 30 is formed on the interlayer insulating layer 64 on the upper surface side of the silicon substrate 10 and on the insulating layer 52 on the lower surface side respectively.

Also, the contact holes CH reaching the first to third n-type impurity diffusion regions 60a, 60b, 60c of the MOS transistors T1, T2 are formed in the interlayer insulating layer 64. Then, the second wiring layers 40a connected to the first to third n-type impurity diffusion regions 60a, 60b, 60c of the MOS transistors T1, T2 through the contact holes CH is formed on the interlayer insulating layer 64. The second wiring layers 40a are formed from the identical layer with the first wiring layers 40.

Like the first embodiment, the first and second wiring layers 40, 40a are constructed by the seed layer 42 functioning as the second barrier metal pattern layer and the conductive pattern layer 44 formed thereon, respectively. That is, the first and second wiring layers 40, 40a are formed to contain the second barrier metal pattern layer at the lowermost part. As a result, it can be prevented that the copper contained in the conductive pattern layer 44 of the second wiring layers 40a diffuses into the MOS transistors T1, T2.

In the semiconductor device 1a of the second embodiment, like the first embodiment, after the penetrating electrodes 20 are covered with the first barrier metal pattern layer 30, the contact holes CH1, CH2 are formed in the interlayer insulating layer 64 to expose the first to third n-type impurity diffusion regions 60a, 60b, 60c of the MOS transistors T1, T2.

Then, as the preprocessing when forming the first and second wiring layers 40, 40a, the natural oxidation film on the surfaces of the first to third n-type impurity diffusion regions 60a, 60b, 60c is removed by the wet process.

At this time, the penetrating electrodes 20 are capped and protected with the first barrier metal pattern layer 30. Therefore, there is no fear that the copper of the penetrating electrodes 20 enters into the first to third n-type impurity diffusion regions 60a, 60b, 60c in the contact holes CH during the wet process. Then, the first and second wiring layers 40, 40a connected to the first barrier metal pattern layer 30 and the MOS transistors T1, T2 are formed simultaneously.

In this manner, in the semiconductor device 1a of the second embodiment, there is no fear that the MOS transistors T1, T2 formed in the silicon substrate 10 suffer the contamination of copper from the penetrating electrodes 20 during the manufacturing process. As a result, the MOS transistors T1, T2 having the desired characteristics can be obtained, and the semiconductor device can be manufactured with good yield.

In the semiconductor device 1a of the second embodiment, a MEMS element (not shown) such as an acceleration sensor, or the like is mounted to be connected to the first and second wiring layers 40, 40a. The MOS transistors T1, T2 acts as the driver IC for the MEMS element.

Then, the first wiring layers 40 on the lower surface side of the silicon substrate 10 are mounted to be connected to the wiring substrate (motherboard).

In this case, there is no necessity that the first wiring layer 40 should always be formed on the lower surface side of the silicon substrate 10, and the connection electrode may be provided to the first barrier metal pattern layer 30 on the lower surface side.

Also, in the case that a plurality of semiconductor devices 1a are obtained from the silicon substrate 10, the silicon substrate 10 is cut before or after the MEMS element is mounted.

(Other Modes of the First and Second Embodiments)

In the first and second embodiments, the example where the Zener diode ZD or the MOS transistors T1, T2 are formed in the silicon substrate 10 as the element is explained. But a capacitor may be formed to the silicon substrate 10 via an insulating layer. The capacitor has such a structure that a dielectric layer is put between the upper electrode and the lower electrode, and is formed by the thin film process. Then, an upper surface of the upper electrode and an upper surface of an extended portion of the lower electrode act as the connection portion.

In this case, similarly contact holes reaching the connection portion of the capacitor are formed in the insulating layer in a state that the penetrating electrodes 20 are covered with the first barrier metal pattern layer 30. Accordingly, such a situation can be prevented that the copper of the penetrating electrodes 20 diffuses into the capacitor during the wet process that is applied prior to the formation of the wiring layer. In particular, in the capacitor employing the material whose characteristics are ready to vary due to the contamination of copper, reliability can be improved.

Also, the silicon substrate 10 is illustrated as the semiconductor substrate. But the present invention may be applied to the manufacturing method in which various semiconductor elements, and the like are formed by using a gallium arsenic (GaAs) substrate, or the like.

(Third Embodiment)

FIGS. 10A to 10D, FIGS. 11A to 11D, FIGS. 12A to 12C, and FIG. 13 are sectional views showing a method of manufacturing a semiconductor device according to a third embodiment of the present invention.

In the third embodiment, the detail explanation of the same steps as those in the first embodiment will be omitted herein.

First, as shown in FIGS. 10A to 10D, the same steps with FIGS. 3A to 3D in the first embodiment are carried out.

Figure 10A:
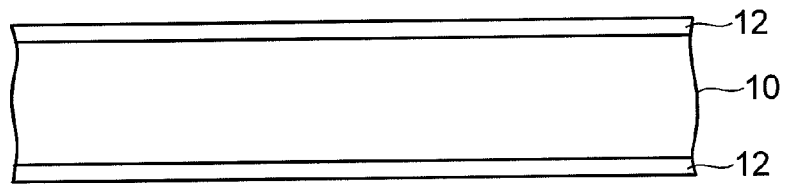
FIGS. 10A to 10D are sectional views (#1) showing a method of manufacturing a semiconductor device according to a third embodiment of the present invention.
Figure 10B:
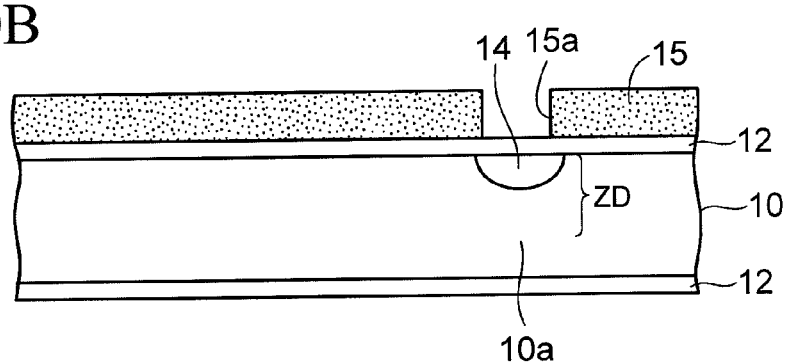
Figure 10C:
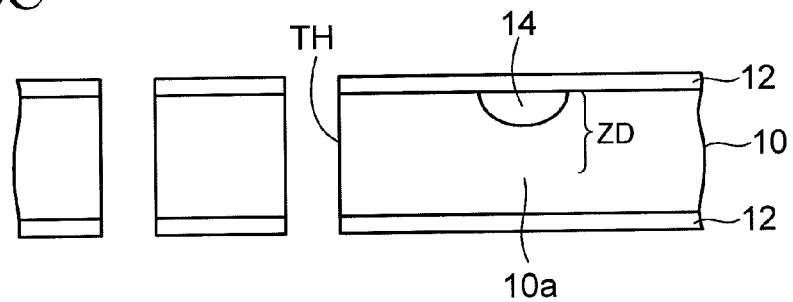
Figure 10D:
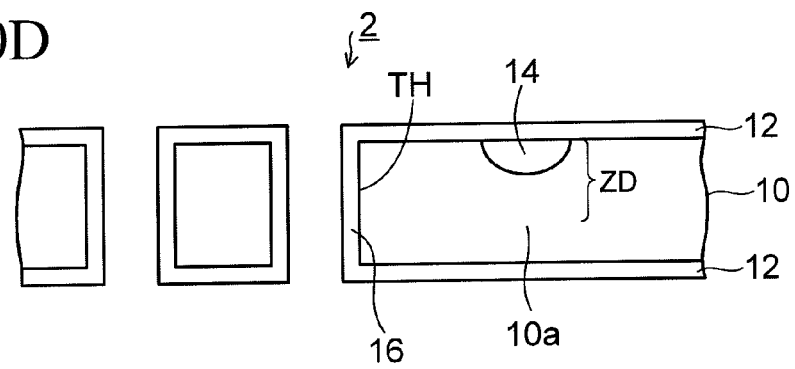

In this manner, as shown in FIG. 10D, the structure 2 similar to FIG. 3D in the first embodiment is obtained.

That is, the structure 2 including the silicon substrate 10, the Zener diode ZD formed therein, the through holes TH penetrating the silicon substrate 10, and the insulating layers 12, 16 formed on both surface sides of the silicon substrate 10 and the inner surfaces of the through holes TH to cover the Zener diode ZD is obtained.

Figure 11A:
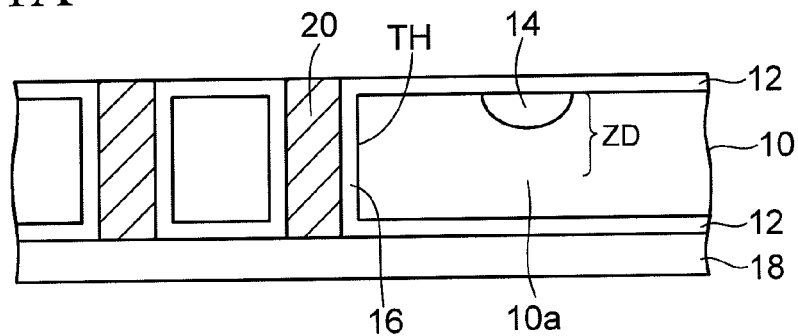
FIGS. 11A to 11D are sectional views (#2) showing the method of manufacturing the semiconductor device according to the third embodiment of the present invention.

Then, as shown in FIG. 11A, by the method similar to FIG. 3D in the first embodiment, the penetrating electrode 20 is formed to be filled in the insides of the through holes TH respectively. Then, the plating power feeding member 18 is removed.

Similarly to the first embodiment, in the case that the penetrating electrode 20 is formed on the through hole TH to protrude from there, the top portions of the penetrating electrodes 20 are polished by the CMP, or the like. Accordingly, the upper surfaces of the penetrating electrodes 20 and the upper surface of the insulating layer 12 constitute the identical surface and are planarized.

Figure 11B:
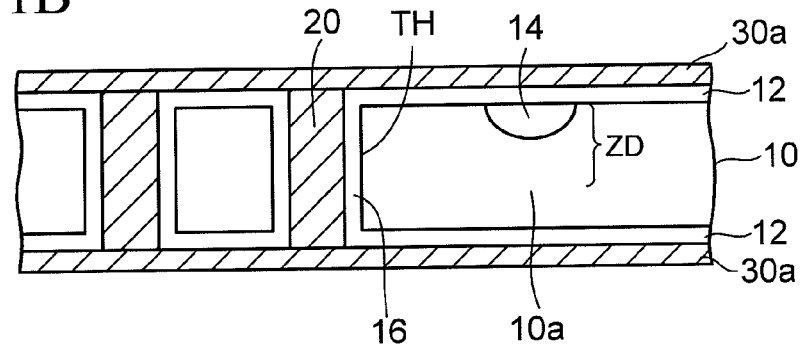

Then, as shown in FIG. 11B, similarly to FIG. 4B in the first embodiment, the first barrier metal layer 30a for covering the insulating layer 12 and the penetrating electrodes 20 is formed on both surface sides of the silicon substrate 10 by the sputter method respectively. As the first barrier metal layer 30a, a titanium (Ti) layer whose thickness is 100 nm is used.

Alternatively, the first barrier metal layer 30a may be formed by forming a titanium nitride (TiN) layer on the Ti layer. Otherwise, the first barrier metal layer 30a may be formed of an aluminum (Al) layer or an aluminum alloy layer.

Figure 11C:
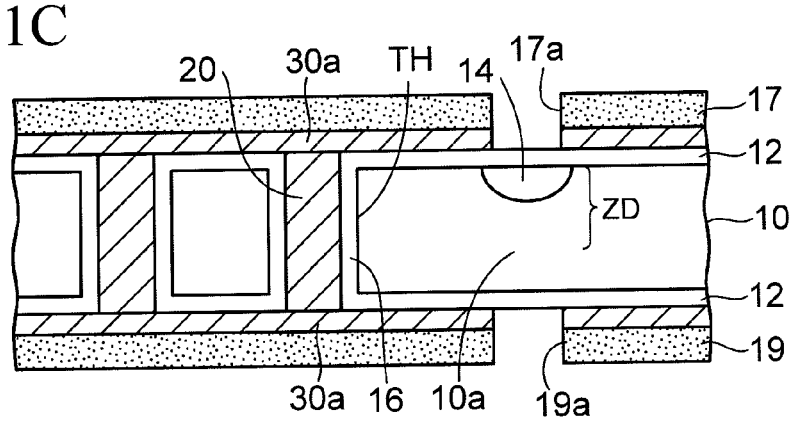

Then, as shown in FIG. 11C, the resist 17 in which the hole-like opening portion 17a is provided in the portion corresponding to the n-type impurity diffusion region 14 of the Zener diode ZD is formed on the first barrier metal layer 30a on the upper surface side of the silicon substrate 10. Then, the resist 19 in which the hole-like opening portion 19a is provided in the portion corresponding to the Zener diode ZD is formed on the first barrier metal layer 30a on the lower surface side of the silicon substrate 10.

Then, the first barrier metal layer 30a on both surface sides of the silicon substrate 10 is etched through the opening portions 17a, 19a by using the resists 17, 19 as a mask respectively.

Figure 11D:
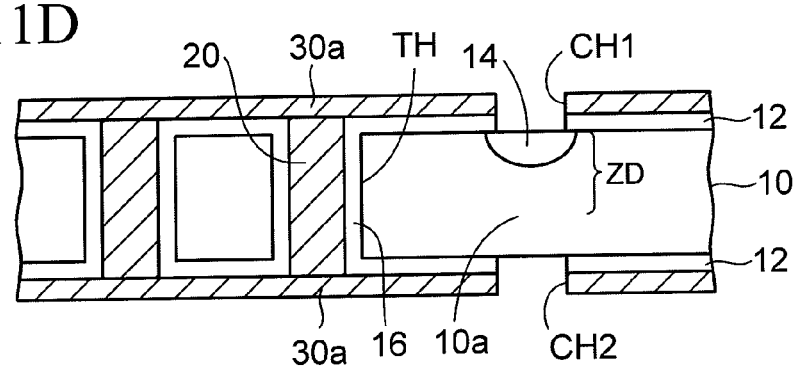

Then, as shown in FIG. 11D, the insulating layer 12 is etched through the opening portion of the first barrier metal layer 30a on both surface sides of the silicon substrate 10 respectively. Then, the resists 17, 19 are removed.

Accordingly, the first barrier metal layer 30a and the insulating layer 12 are processed on the upper surface side of the silicon substrate 10, and thus the contact hole CH1 reaching the n-type impurity diffusion region 14 (connection portion) of the Zener diode ZD is formed. Also, the first barrier metal layer 30a and the insulating layer 12 are processed on the lower surface side of the silicon substrate 10, and thus the contact hole CH2 reaching the lower surface (connection portion) of the p-type silicon portion 10a of the Zener diode ZD is formed.

At this time, like the above related art, the n-type impurity diffusion region 14 and the lower surface of the p-type silicon portion 10a, which are exposed in the contact holes CH1, CH2 respectively, of the Zener diode ZD are exposed to an atmosphere. Thus, such a situation is obtained that a natural oxide film ($SiO_2$) is formed thereon.

Then, the silicon substrate 10 is dipped in the etching tub (not shown) in which an etchant solution such as dilute HF, or the like is filled. Thus, the natural oxide film is removed from the n-type impurity diffusion region 14 and the lower surface of the p-type silicon portion 10a in the contact holes CH1, CH2.

At this time, the upper and lower surfaces of the penetrating electrodes 20 are protected by the first barrier metal pattern layer 30. Therefore, there is no fear that the copper diffuses into an etchant solution in the etching tub from the penetrating electrodes 20. Therefore, the Zener diode ZD exposed in the contact holes CH1, CH2 is not contaminated with the copper, and as a result the Zener diode ZD having the desired characteristics can be obtained.

Also, the natural oxide film is removed from the connection portion of the Zener diode ZD. Therefore, the wiring layer described later can be connected to the Zener diode ZD with low contact resistance and with good reliability.

Figure 12A:
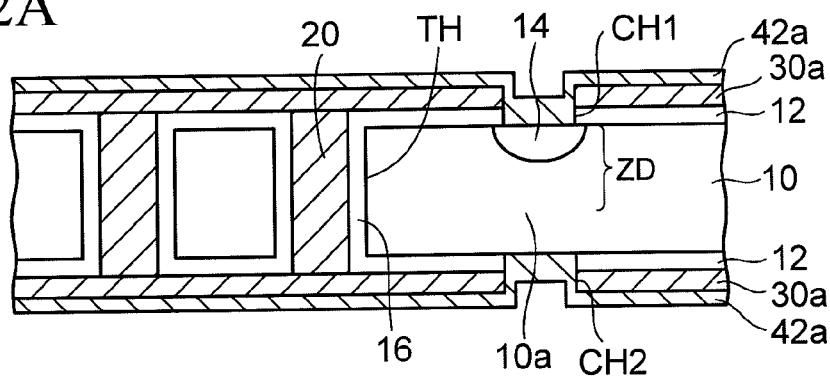
FIGS. 12A to 12C are sectional views (#3) showing the method of manufacturing the semiconductor device according to the third embodiment of the present invention.

Then, as shown in FIG. 12A, a second barrier metal layer 42a is formed on the first barrier metal layer 30a and in the contact holes CH1, CH2 on both surface sides of the silicon substrate 10 by the sputter method respectively. The second barrier metal layer 42a acts as not only the barrier metal layer but also the seed layer used as the plating power feeding path of the electroplating.

For example, the second barrier metal layer 42a is formed of a Ti layer (film thickness: 50 nm)/a Cu layer (film thickness: 300 nm) in order from the bottom. Otherwise, the second barrier metal layer 42a may be formed of a Ti layer/a TiN layer, or a Ti layer/a TiN layer/a Cu layer in order from the bottom.

Figure 12B:
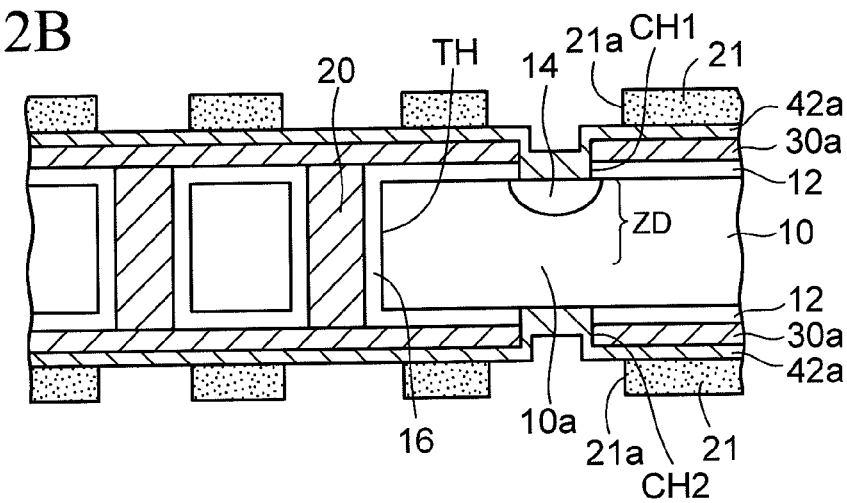

Then, as shown in FIG. 12B, the plating resist in which the opening portion 21a is provided on the portion where the wiring layer is arranged is formed on the second barrier metal layer 42a on both surface sides of the silicon substrate 10 respectively.

Figure 12C:
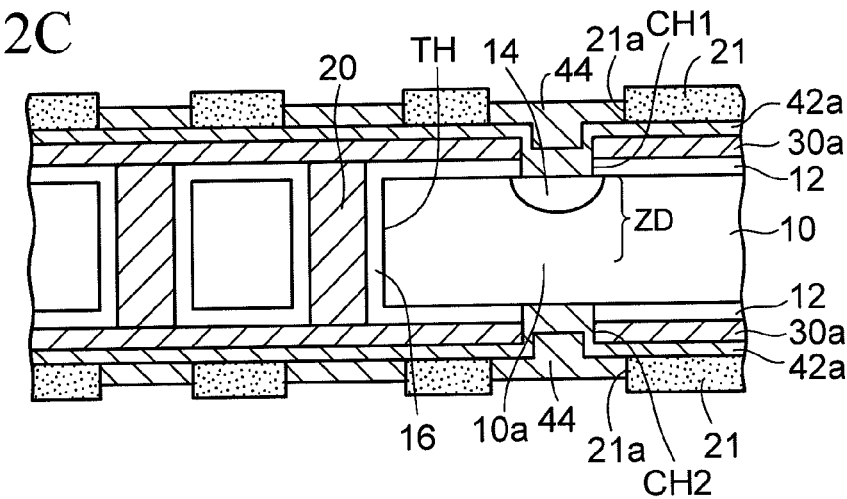

Then, as shown in FIG. 12C, the conductive pattern layer 44 is formed in the opening portion 21a of the plating resist 21 on both surface sides of the silicon substrate 10 by the electroplating utilizing the second barrier metal layer 42a (seed layer) as the plating power feeding path. For example, the conductive pattern layer 44 is formed of a Cu layer (film thickness: 500 nm)/a Ni layer (film thickness: 300 nm)/an Au layer (film thickness: 100 nm) in order from the bottom.

Then, the plating resist 21 is removed on both surface sides of the silicon substrate 10, and then the second barrier metal layer 42a and the first barrier metal layer 30a are etched by using the conductive pattern layer 44 as a mask.

Figure 13:
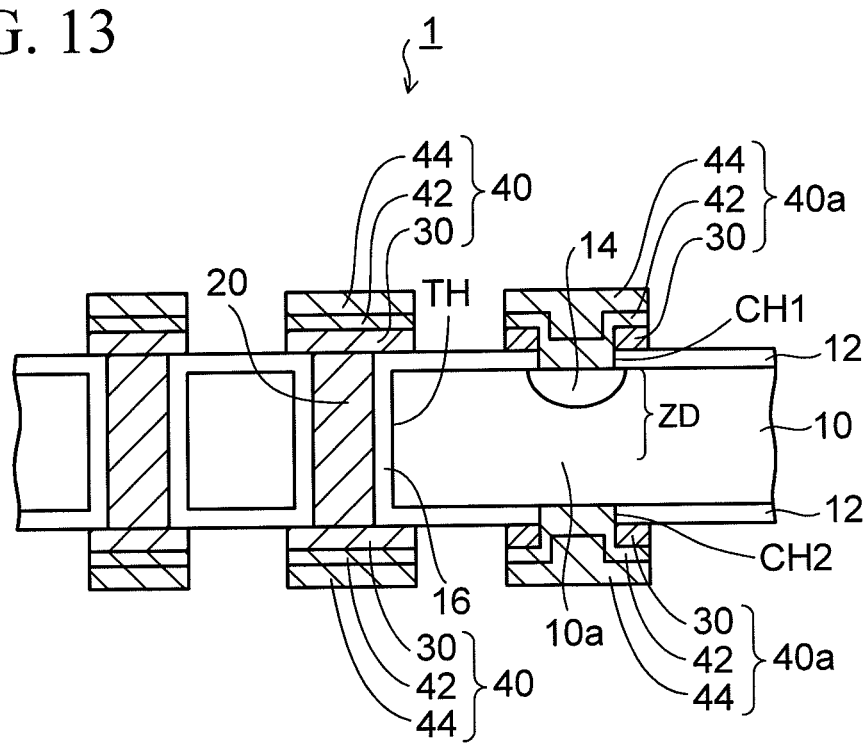
FIG. 13 is a sectional view (#4) showing the method of manufacturing the semiconductor device according to the third embodiment of the present invention.

Accordingly, as shown in FIG. 13, the first wiring layers 40 each connected electrically to the penetrating electrode 20 to cover it are formed on both surface sides of the silicon substrate 10 respectively. The first wiring layer 40 is constructed by the first barrier metal pattern layer 30 that the first barrier metal layer 30a is patterned, a second barrier metal pattern layer 42 that the second barrier metal layer 42a is patterned, and the conductive pattern layer 44 in order from the bottom.

Also, the second wiring layer 40a connected electrically to the connection portion of the Zener diode ZD through the contact holes CH1, CH2 is formed on both surface sides of the silicon substrate 10 respectively. The second wiring layer 40a is formed from the identical layer with the first wiring layer 40.

In the second wiring layers 40a, the first barrier metal pattern layer 30 is formed on the insulating layer 12 except the contact holes CH1, CH2, and the second barrier metal pattern layer 42 is connected electrically to the connection portion of the Zener diode ZD.

The first and second wiring layers 40, 40a may be formed like the island-like pattern to cover the penetrating electrode 20 and the contact holes CH1, CH2, or may be formed as the leading wire that extends outward from the penetrating electrode 20 and the contact holes CH1, CH2. Also, a multi-layered wiring may be formed on the first and second wiring layers 40, 40a and connected thereto.

With the above, the semiconductor device 1 of the third embodiment is obtained.

As shown in FIG. 13, in the semiconductor device of the third embodiment, the n-type impurity diffusion region 14 is formed on the surface layer portion of the p-type silicon substrate 10, so that the Zener diode ZD (element) is constructed by the n-type impurity diffusion region 14 and the p-type silicon portion 10a.

The through holes TH are formed in the silicon substrate 10 to penetrate it in the thickness direction. The insulating layer 12 is formed both surface sides of the silicon substrate 10, and the insulating layer 16 is formed on the inner surfaces of the through holes TH. The penetrating electrode 20 made of the copper is formed to be filled in the through holes TH respectively.

Also, the first wiring layer 40 connected electrically to the upper and lower surfaces of the penetrating electrode 20 is formed on both surface sides of the silicon substrate 10 respectively. The first wiring layer 40 is constructed by the first barrier metal pattern layer 30 connected to the penetrating electrode 20 and contact it, the second barrier metal pattern layer 42, and the conductive pattern layer 44 in order from the bottom.

Also, the contact holes CH1, CH2 which reach the n-type impurity diffusion region 14 (connection portion) and the lower surface (connection portion) of the p-type silicon portion 10a of the Zener diode ZD are formed in the insulating layer 12 on both surface sides of the silicon substrate 10 respectively.

Then, the second wiring layers 40a connected to the n-type impurity diffusion region 14 (connection portion) through the contact hole CH1 is formed on the insulating layer 12 on the upper surface side of the silicon substrate 10. Similarly, the second wiring layers 40a connected to the lower surface (connection portion) of the p-type silicon portion 10a of the Zener diode ZD through the contact hole CH2 is formed on the insulating layer 12 on the lower surface side of the silicon substrate 10. The second wiring layers 40a is formed from the identical layer with the first wiring layer 40.

The second wiring layers 40a on the upper surface side is constructed by the first barrier metal pattern layer 30 formed on the insulating layer 12 except the contact hole CH1, the second barrier metal pattern layer 42 formed on the first barrier metal pattern layer 30 and the contact hole CH1, and the conductive pattern layer 44 formed thereon. Then, the second barrier metal pattern layer 42 contacts the n-type impurity diffusion region 14 (connection portion) of the Zener diode ZD and is connected to this portion.

Also, the second wiring layers 40a on the lower surface side is constructed by the first barrier metal pattern layer 30 formed on the insulating layer 12 except the contact hole CH2, the second barrier metal pattern layer 42 formed on the first barrier metal pattern layer 30 and the contact hole CH2, and the conductive pattern layer 44 formed thereon. Then, the second barrier metal pattern layer 42 contacts the lower surface (connection portion) of the p-type silicon portion 10a of the Zener diode ZD and is connected to this portion.

In the second wiring layers 40a, the first barrier metal pattern layer 30 is not arranged in the contact holes CH1, CH2, but it can be prevented that the copper contained in the conductive pattern layer 44 diffuses into the Zener diode ZD by the barrier function of the second barrier metal pattern layer 42.

As described above, in the method of manufacturing the semiconductor device 1 of the third embodiment, after the penetrating electrodes are covered with the first barrier metal layer 30a, the contact holes CH1, CH2 that cause the n-type impurity diffusion region 14 and the p-type silicon portion 10a of the Zener diode ZD to expose are formed in the first barrier metal layer 30a and the insulating layer 12.

Then, as the preprocessing when forming the first and second wiring layers 40, 40a, the natural oxide film formed on the n-type impurity diffusion region 14 and the lower surface of the p-type silicon portion 10a of the Zener diode ZD is removed.

At this time, the penetrating electrodes 20 are protected with the first barrier metal layer 30a. Therefore, the copper of the penetrating electrodes 20 does not diffuse into an etchant solution during the wet process, and thus there is no fear that the Zener diode ZD is contaminated with the copper. Then, the first and second wiring layers 40, 40a connected to the penetrating electrodes 20 and the Zener diode ZD are formed simultaneously by utilizing the first barrier metal layer 30a.

The semiconductor device 1 of the third embodiment is manufactured by such manufacturing method. Therefore, the wiring structure connected to the penetrating electrodes 20 is different from the wiring structure connected to the Zener diode ZD.

That is, in the first wiring layers 40 connected to the penetrating electrodes 20, the first barrier metal pattern layer 30 for protecting the penetrating electrodes 20 from the wet process is formed to contact the upper and lower surfaces of the penetrating electrodes 20.

In contrast, in the second wiring layers 40a connected to the Zener diode ZD, the first barrier metal pattern layer 30 is formed on the insulating layer 12 except the contact holes CH1, CH2, and the second wiring layers 40a is directly connected to the Zener diode ZD without the intervention of the first barrier metal pattern layer 30.

In this manner, in the semiconductor device 1 of the third embodiment, there is no fear that the Zener diode ZD formed in the silicon substrate 10 suffers the contamination of copper from the penetrating electrodes 20 during the manufacturing process. As a result, the Zener diode ZD having the desired characteristics can be obtained, and the semiconductor device can be manufactured with good yield.

In the semiconductor device 1 of the third embodiment, the second wiring layers 40a connected to the n-type impurity diffusion region 14 of the Zener diode ZD acts as a minus (−) electrode, and the second wiring layers 40a connected to the lower surface of the p-type silicon portion 10a acts as a plus (+) electrode. Thus, the rectifying characteristic of the Zener diode ZD is obtained.

Then, the light emitting element (not shown) such as LED, or the like is mounted to be connected to the first and second wiring layers 40, 40a, and the Zener diode ZD is connected electrically in parallel with the light emitting element in the power line and acts as the power regulator. Then, the first and second wiring layers 40, 40a on the lower surface side of the silicon substrate 10 are connected to the wiring substrate (motherboard).

In the example of the semiconductor device 1 in FIG. 13, the lower surface of the p-type silicon portion 10a of the Zener diode ZD is used as the connection portion. In this case, the upper surface of the p-type silicon portion 10a on the outside of the n-type impurity diffusion region 14 may be used as the connection portion, and the contact hole reaching the upper surface of the p-type silicon portion 10a may be formed in the insulating layer 12 on the upper surface side.

Also, in the case that the contact hole for the element is not formed on the lower surface, at least the first barrier metal pattern layer 30 for covering the lower surfaces of the penetrating electrodes 20 may be formed on the lower surface side of the silicon substrate 10. There is no necessity that the second barrier metal pattern layer 42 and the conductive pattern layer 44 should always be formed on the lower surface side. In this case, the first barrier metal pattern layer 30 is formed by directly patterning the first barrier metal layer 30a (FIG. 11D), and the connection electrode may be provided to the first barrier metal pattern layer 30.

Also, in the present embodiment, the first and second wiring layers 40, 40a are formed based on the semi-additive process. In this case, various wiring forming methods such as the subtractive process, and the like may be employed.

Also, in the case that a plurality of semiconductor devices 1 are obtained from the silicon substrate 10, the silicon substrate 10 is cut before or after the light emitting element is mounted.

(Fourth Embodiment)

FIGS. 14A to 14C, FIGS. 15A to 15C, FIGS. 16A to 16C, and FIGS. 17A to 17C are sectional views showing a method of manufacturing a semiconductor device according to a fourth embodiment of the present invention. In the fourth embodiment, a transistor is formed in the silicon substrate instead of the Zener diode in the third embodiment described above.

In the fourth embodiment, the detail explanation of the same steps as those in the third embodiment will be omitted herein.

Figure 14A:
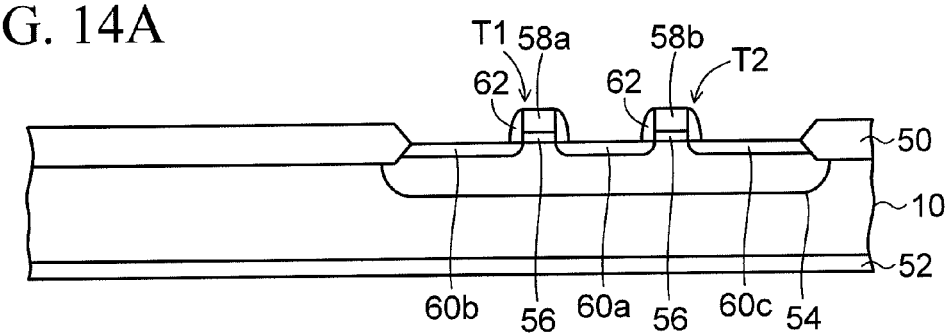
FIGS. 14A to 14C are sectional views (#1) showing a method of manufacturing a semiconductor device according to a fourth embodiment of the present invention.

First, as shown in FIG. 14A, the same structure as that in FIG. 7A of the second embodiment is prepared.

Figure 14B:
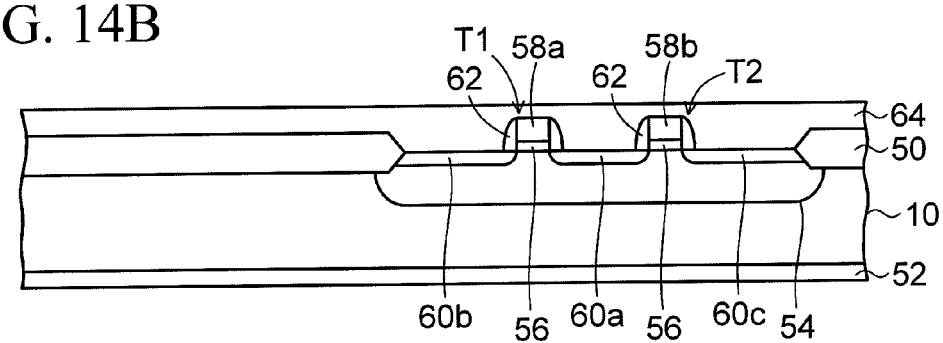

Then, as shown in FIG. 14B, like above FIG. 7B of the second embodiment, a silicon oxide layer is formed as the interlayer insulating layer 64 on the MOS transistors T1, T2 by the CVD method. Then, an upper surface of the interlayer insulating layer 64 is planarized by the CMP. Accordingly, the MOS transistors T1, T2 formed on the silicon substrate 10 are covered with the interlayer insulating layer 64.

Then, a mask (not shown) in which openings are provided and which is made of a resist, or the like is formed on the interlayer insulating layer 64. Then, the interlayer insulating layer 64, the element isolation insulating layer 50, the silicon substrate 10, and the insulating layer 52 under it are penetration-processed by the dry etching through the openings of the mask. Then, the mask is removed.

Figure 14C:
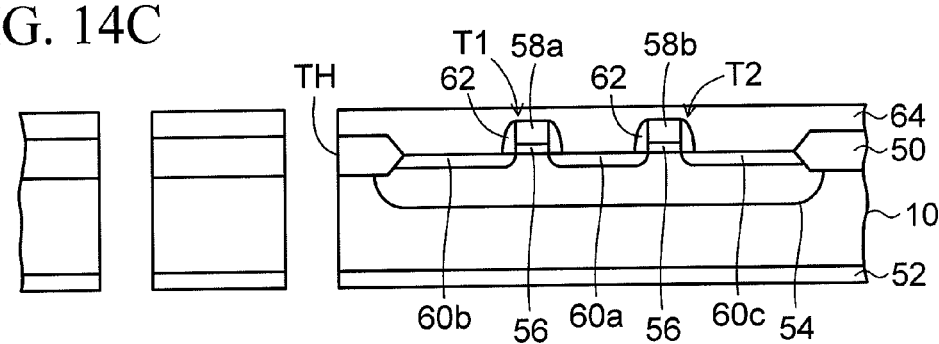

Accordingly, as shown in FIG. 14C, like above FIG. 7C of the second embodiment, the through holes TH are formed in the interlayer insulating layer 64, the element isolation insulating layer 50, the silicon substrate 10, and the insulating layer 52 to penetrate in their thickness direction.

Figure 15A:
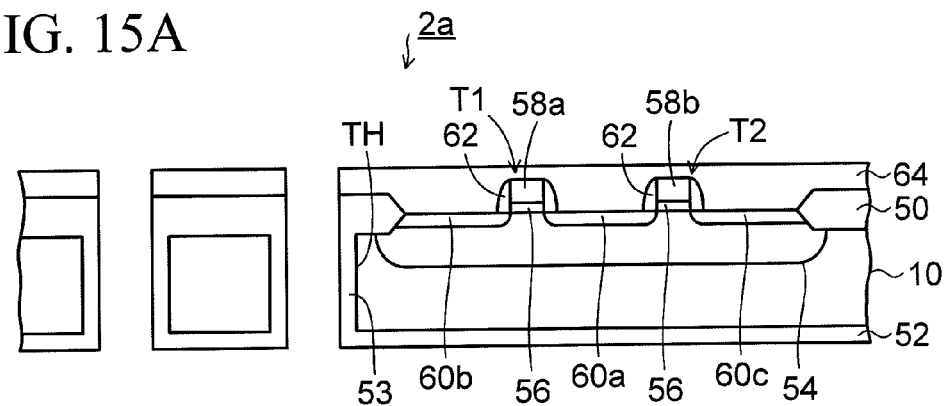
FIGS. 15A to 15C are sectional views (#2) showing the method of manufacturing the semiconductor device according to the fourth embodiment of the present invention.

Then, as shown in FIG. 15A, like above FIG. 8A of the second embodiment, the insulating layer 53 is formed on the inner surfaces of the through holes TH by thermally oxidizing the silicon substrate 10. In this case, in the case that the heating process applied to the thermal oxidation influences the characteristics of the MOS transistors T1, T2, the insulating layer 53 may be formed on the inner surfaces of the through holes TH and both surface sides of the silicon substrate 10 by the CVD method. Also, in above FIG. 14A, in the case that the insulating layer 52 is not formed on the lower surface of the silicon substrate 10, the insulating layer 52 is formed simultaneously on the inner surfaces of the through holes TH and the lower surface of the silicon substrate 10.

In this manner, the structure 2a including silicon substrate 10, the MOS transistors T1, T2 formed thereon, the through holes TH penetrating the silicon substrate 10, and the insulating layer (the interlayer insulating layer 64, the insulating layers 52, 53) formed on both surface sides of the silicon substrate 10 and the inner surfaces of the through holes TH to cover the MOS transistors T1, T2 is obtained.

Figure 15B:
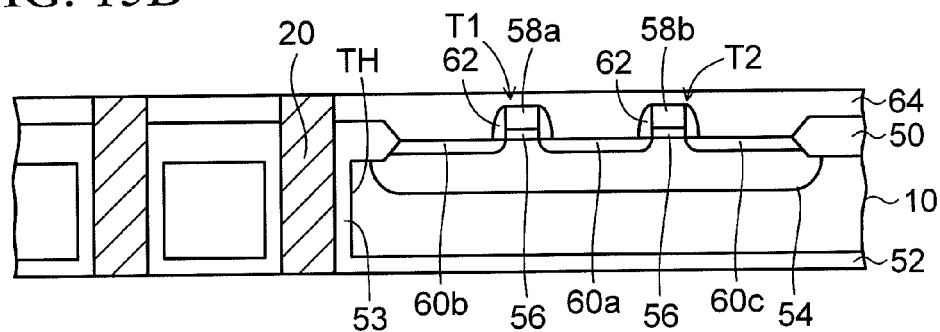

Then, as shown in FIG. 15B, the penetrating electrode 20 made of copper is formed in the through holes TH of the silicon substrate 10 respectively by the electroplating similar to that in the third embodiment.

Figure 15C:
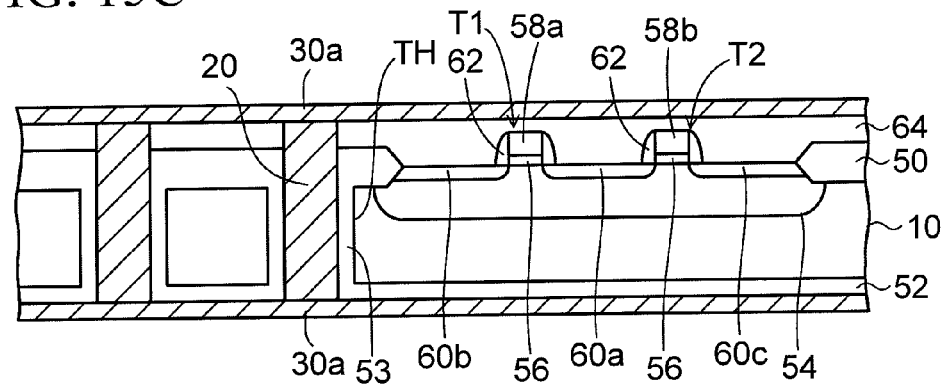

Then, as shown in FIG. 15C, the first barrier metal layer 30a for covering the upper and lower surfaces of the penetrating electrodes 20 is formed on both surface sides of the silicon substrate 10 respectively by the method explained in FIG. 11B of the third embodiment.

Figure 16A:
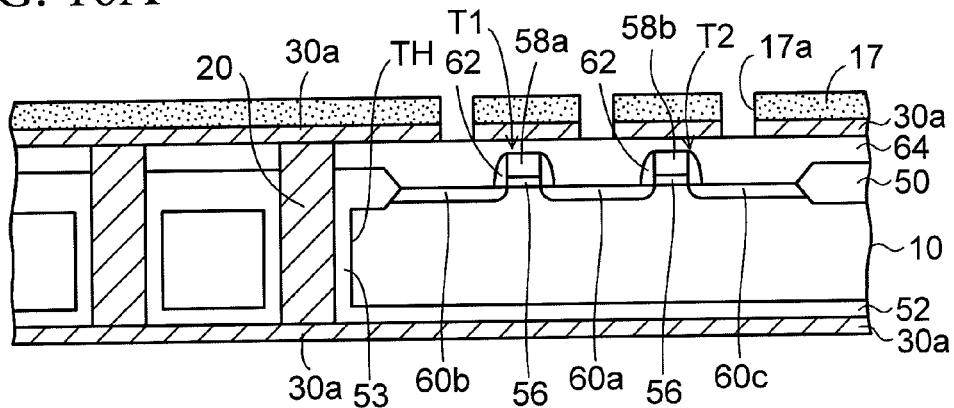
FIGS. 16A to 16C are sectional views (#3) showing the method of manufacturing the semiconductor device according to the fourth embodiment of the present invention.

Then, as shown in FIG. 16A, the resist 17 in which the hole-like openings 17a are provided is formed on the interlayer insulating layer 64 on the upper surface side of the silicon substrate 10. Then, the first barrier metal layer 30a is etched through the opening portions 17a of the resist 17.

Figure 16B:
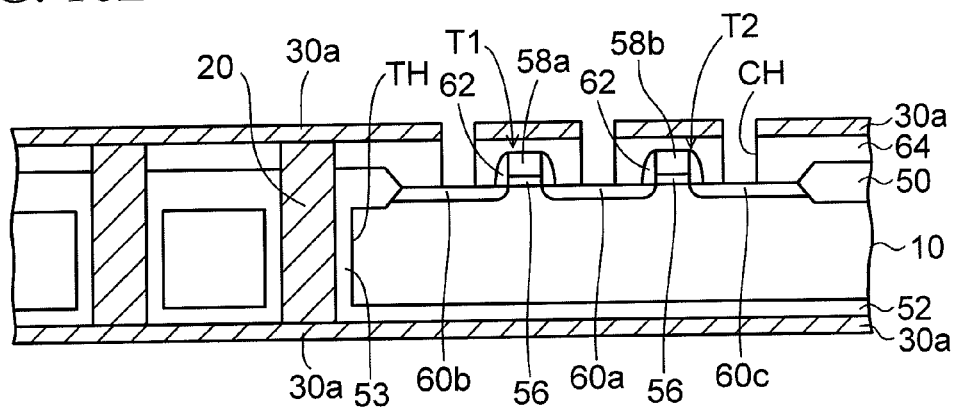

Then, as shown in FIG. 16B, the interlayer insulating layer 64 is etched through the opening portions in the first barrier metal layer 30a. Then, the resist 17 is removed.

Thus, the first barrier metal layer 30a and the interlayer insulating layer 64 are processed. Accordingly, the contact holes CH reaching the first to third n-type impurity diffusion regions 60a, 60b, 60c respectively are formed.

In the fourth embodiment, in this state, the natural oxide film is also formed on the surfaces of the first to third n-type impurity diffusion regions 60a, 60b, 60c exposed in the contact holes CH. Therefore, the natural oxide film in the contact holes CH is removed by the wet process similar to that in the third embodiment.

At this time, like the third embodiment, the penetrating electrodes 20 are protected with the first barrier metal layer 30a. Therefore, there is no fear that the copper of the penetrating electrodes 20 enters into the first to third n-type impurity diffusion regions 60a, 60b, 60c in the contact holes CH during the wet process. As a result, a deterioration of the characteristics of the MOS transistors T1, T2 can be prevented, and the desired transistor characteristics can be obtained.

Also, the natural oxide film on the connection portions of the MOS transistors T1, T2 is removed. Therefore, the wiring layers described later are connected to the MOS transistors T1, T2 with low contact resistance and with good reliability.

Figure 16C:
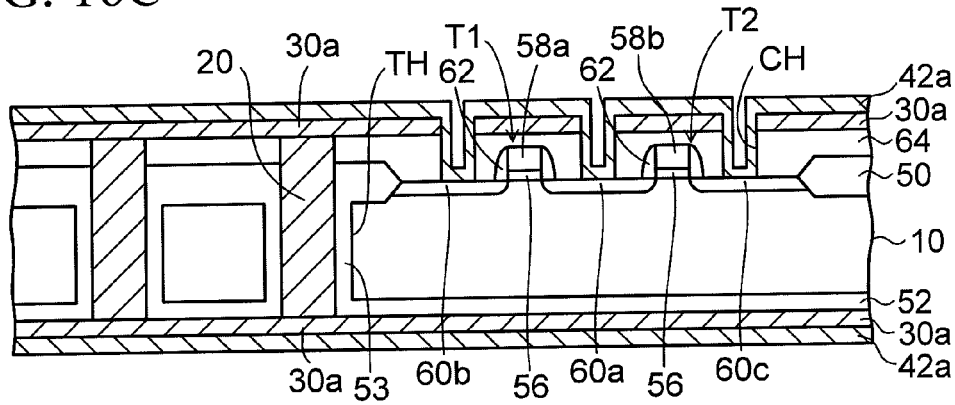

Then, as shown in FIG. 16C, the second barrier metal layer 42a is formed on the interlayer insulating layer 64 and in the contact holes CH on the upper surface side of the silicon substrate 10.

Also, the second barrier metal layer 42a is formed on the first barrier metal layer 30a on the lower surface side of the silicon substrate 10. Like the third embodiment, the second barrier metal layer 42a functions as the barrier layer and also functions as the seed layer in the electroplating.

Figure 17A:
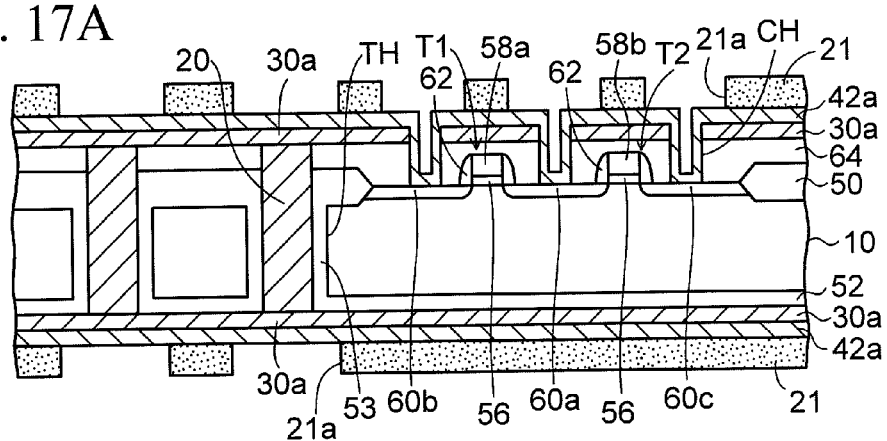
FIGS. 17A to 17C are sectional views (#4) showing the method of manufacturing the semiconductor device according to the fourth embodiment of the present invention.

Then, as shown in FIG. 17A, like the third embodiment, the plating resist 21 in which the opening portions 21a are provided in the portions where the wiring layer is arranged is formed on both surface sides of the silicon substrate 10 respectively.

Figure 17B:
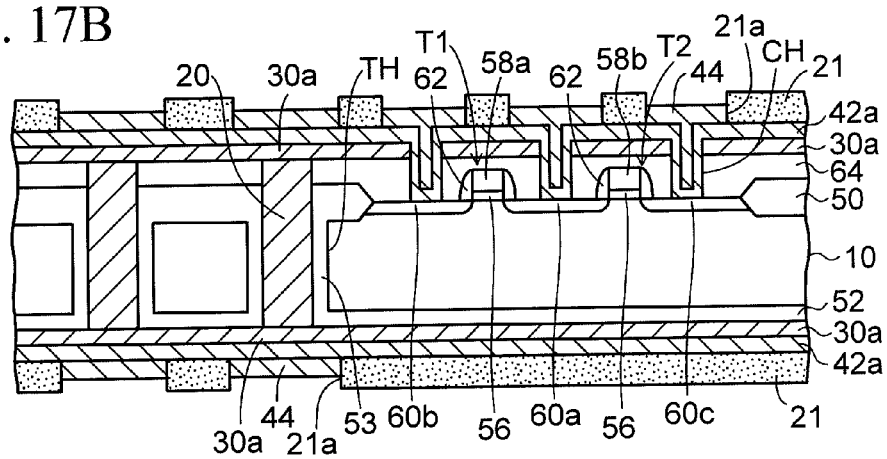

Then, as shown in FIG. 17B, the conductive pattern layer 44 is formed in the opening portions 21a of the plating resist 21 on both surface sides of the silicon substrate 10 respectively, by using the electroplating utilizing the second barrier metal layer 42a (seed layer) as the plating power feeding path. The conductive pattern layer 44 is formed to be filled in the contact holes CH.

Then, the plating resist 21 is removed from both surface sides of the silicon substrate 10, and then the second barrier metal layer 42a and the first barrier metal layer 30a are etched by using the conductive pattern layer 44 as a mask.

Figure 17C:
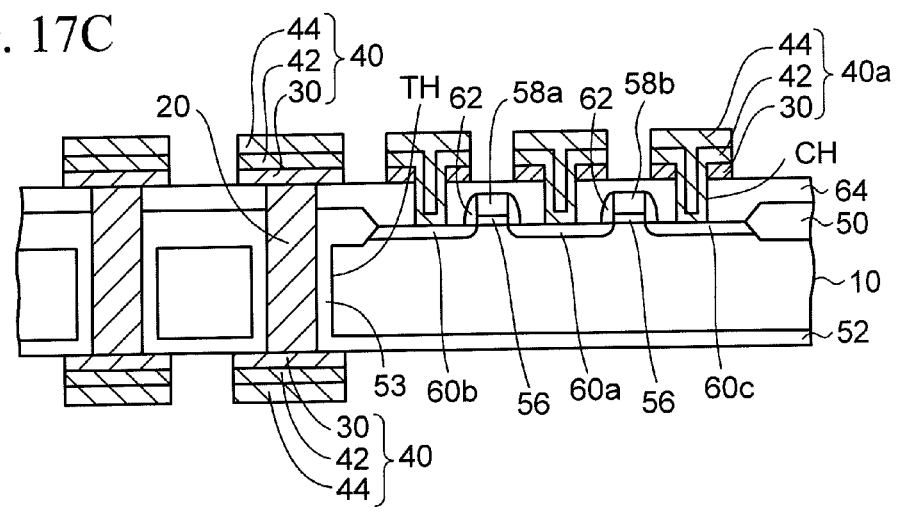

Accordingly, as shown in FIG. 17C, the first wiring layers 40 connected to the upper surface of the penetrating electrode 20, and the second wiring layers 40a connected to the first to third n-type impurity diffusion regions 60a, 60b, 60c of the MOS transistors T1, T2 through the contact holes CH are formed on the interlayer insulating layer 64 on the upper surface side of the silicon substrate 10. At the same time, the first wiring layers 40 connected to the lower surfaces of the penetrating electrode 20 are formed on the insulating layer 52 on the lower surface side of the silicon substrate 10.

Respective layer structures of the first and second wiring layers 40, 40a are identical to those in the third embodiment.

With the above, the semiconductor device 1a of the fourth embodiment can be obtained.

As shown in FIG. 17C, in the semiconductor device 1a of the fourth embodiment, the element isolation insulating layer 50 is formed to surround the transistor forming region on the upper surface side of the silicon substrate 10. The MOS transistors T1, T2 (elements) are formed in the transistor forming region.

The interlayer insulating layer 64 is formed on the element isolation insulating layer 50 and the MOS transistors T1, T2. Also, the insulating layer 52 is formed on the lower surface side of the silicon substrate 10.

The through holes TH are formed in the interlayer insulating layer 64, the silicon substrate 10, and the insulating layer 52 to penetrate them in their thickness direction. Then, the insulating layer 53 is formed on the inner surfaces of the through holes TH.

The penetrating electrode 20 made of copper is formed in the through holes TH respectively. Then, the first wiring layer 40 connected to the upper and lower surfaces of the penetrating electrodes 20 is formed on both surface sides of the silicon substrate 10 respectively. The first wiring layer 40 is constructed by the first barrier metal pattern layer 30, the second barrier metal pattern layer 42, and the conductive pattern layer 44 in order from the bottom.

Also, the contact holes CH reaching the first to third n-type impurity diffusion regions 60a, 60b, 60c of the MOS transistors T1, T2 are formed in the interlayer insulating layer 64. Also, the second wiring layers 40a connected to the first to third n-type impurity diffusion regions 60a, 60b, 60c of the MOS transistors T1, T2 through the contact holes CH respectively is formed on the interlayer insulating layer 64.

The second wiring layers 40a is constructed by the first barrier metal pattern layer 30 formed on the insulating layer 12 except the contact hole CH1, the second barrier metal pattern layer 42 formed on the first barrier metal pattern layer 30 and the contact hole CH1, and the conductive pattern layer formed thereon. Then, the second barrier metal pattern layer 42 contacts the first to third n-type impurity diffusion regions 60a, 60b, 60c (connection portion) of the MOS transistors T1, T2 and is connected to this portion.

Like the third embodiment, the first barrier metal pattern layer 30 is not arranged in the contact holes CH in the second wiring layer 40a. In this case, such an event can be prevented by the barrier function of the second barrier metal pattern layer 42 that the copper contained in the conductive pattern layer 44 diffuses into the n-type impurity diffusion regions 60a, 60b, 60c.

In the semiconductor device 1a of the fourth embodiment, like the third embodiment, after the penetrating electrodes 20 are covered with the first barrier metal layer 30a, the contact holes CH that cause the first to third n-type impurity diffusion regions 60a, 60b, 60c of the MOS transistors T1, T2 to expose are formed in the first barrier metal layer 30a and the interlayer insulating layer 64.

Then, as the preprocessing when forming the first and second wiring layers 40, 40a, the natural oxidation film on the surfaces of the first to third n-type impurity diffusion regions 60a, 60b, 60c is removed by the wet process.

At this time, the penetrating electrodes 20 are capped and protected with the first barrier metal pattern layer 30. Therefore, there is no fear that the copper enters into the first to third n-type impurity diffusion regions 60a, 60b, 60c from the penetrating electrodes 20 during the wet process. Then, the first and second wiring layers 40, 40a connected to the penetrating electrodes 20 and the MOS transistors T1, T2 by utilizing the first barrier metal layer 30a are formed respectively.

In this manner, in the semiconductor device 1a of the fourth embodiment, there is no fear that the MOS transistors T1, T2 formed in the silicon substrate 10 suffer the contamination of copper from the penetrating electrodes 20 during the manufacturing process. As a result, the MOS transistors T1, T2 having the desired characteristics can be obtained, and the semiconductor device can be manufactured with good yield.

In the semiconductor device 1a of the fourth embodiment, the MEMS element (not shown) such as an acceleration sensor, or the like is mounted to be connected to the first and second wiring layers 40, 40a. The MOS transistors T1, T2 acts as the driver IC for the MEMS element.

Then, the first wiring layers 40 on the lower surface side of the silicon substrate 10 are mounted to be connected to the wiring substrate (motherboard).

Here, at least the first barrier metal pattern layer 30 for covering the bottom surfaces of the penetrating electrodes 20 may be formed on the lower surface side of the silicon substrate 10, and there is no necessity that the second barrier metal pattern layer 42 and the conductive pattern layer 44 should always be formed on the lower surface side. In this case, the first barrier metal pattern layer may be formed by patterning directly the first barrier metal layer 30a (FIG. 16A), and the connection electrode may be provided to the first barrier metal pattern layer 30.

Also, when a plurality of semiconductor devices 1a are obtained from the silicon substrate 10, the silicon substrate 10 is cut before or after the MEMS element is mounted.

(Other Modes of the Third and Fourth Embodiments)

In the third and fourth embodiments, the example that the Zener diode ZD or the MOS transistors T1, T2 are formed in the silicon substrate 10 as the element is explained. In this case, the capacitor may be formed in the silicon substrate 10 via the insulating layer. The capacitor has such a structure that the dielectric layer is put between the upper electrode and the lower electrode, and is formed by the thin film process. Then, the upper surface of the upper electrode and the upper surface of the extended portion of the lower electrode act as the connection portion.

In this case, similarly the contact holes reaching the connection portion of the capacitor are formed in the insulating layer in a state that the penetrating electrodes 20 are covered with the first barrier metal pattern layer 30. Accordingly, such a situation can be prevented that the copper of the penetrating electrodes 20 diffuses into the capacitor during the wet process that is applied prior to the formation of the wiring layer. In particular, in the capacitor employing the material whose characteristics are ready to vary due to the contamination of copper, reliability can be improved.

Also, the silicon substrate 10 is illustrated as the semiconductor substrate. But the present invention may be applied to the manufacturing method in which various semiconductor elements, and the like are formed by using a gallium arsenic (GaAs) substrate, or the like.

What is claimed is:

1. A semiconductor device, comprising:
  a semiconductor substrate;
  an element formed to the semiconductor substrate;
  a through hole formed to penetrate the semiconductor substrate;
  an insulating layer formed on both surface sides of the semiconductor substrate and an inner surface of the through hole;
  a penetrating electrode formed in the through hole;
  a contact hole formed in the insulating layer, and reaching a connection portion of the element;
  a barrier metal pattern layer formed on both surface sides of the semiconductor substrate, and covering the penetrating electrode, the barrier metal pattern layer being in direct contact with the penetrating electrode, wherein the barrier metal pattern layer is formed of any one of a titanium layer/a titanium nitride layer stacked in order from a bottom, an aluminum layer, and an aluminum alloy layer, and no barrier metal pattern layer exists on the element;
  a first wiring layer formed at least on an upper surface side of the semiconductor substrate, and connected to the barrier metal pattern layer, wherein the first wiring layer includes a first seed layer directly formed on the barrier metal pattern layer and a first conductive layer directly formed on the first seed layer; and
  a second wiring layer formed at least on the upper surface side of the semiconductor substrate, wherein the second wiring layer includes a second seed layer being in direct contact with the connection portion of the element in the contact hole and a second conductive layer directly formed on the second seed layer.

2. A semiconductor device according to claim 1, wherein the element is a Zener diode, a transistor, or a capacitor.

3. A semiconductor device according to claim 1, wherein the element is a Zener diode that is constructed by forming an impurity diffusion region whose conductivity type is an opposite conductivity type to the semiconductor substrate to a surface layer portion of the semiconductor substrate, and the impurity diffusion region and a lower surface of the semiconductor substrate act as the connection portion, and
  the contact hole is formed in the insulating layer on both surface sides of the semiconductor substrate.

4. A semiconductor device, comprising:
  a semiconductor substrate;
  an element formed to the semiconductor substrate;
  a through hole formed to penetrate the semiconductor substrate;
  an insulating layer formed on both surface sides of the semiconductor substrate and an inner surface of the through hole;
  a penetrating electrode formed in the through hole;
  a contact hole formed in the insulating layer, and reaching a connection portion of the element;
  a first wiring layer including a first barrier metal pattern layer being in direct contact with the penetrating electrode, a first seed layer directly formed on the first barrier metal pattern layer and a first conductive layer directly formed on the first seed layer; and
  a second wiring layer including a second barrier metal pattern layer arranged in a portion except the contact hole, a second seed layer being in direct contact with the connection portion of the element in the contact hole and the second barrier metal pattern layer, and a second conductive layer directly formed on the second seed layer,
  wherein the first and second barrier metal pattern layers are formed of any one of a titanium layer/a titanium nitride layer stacked in order from a bottom, an aluminum layer, and an aluminum alloy layer, and no first and second barrier metal pattern layers exist on the contact hole.

5. A semiconductor device according to claim 4, wherein the element is a Zener diode, a transistor, or a capacitor.

6. A semiconductor device according to claim 4, wherein the element is a Zener diode that is constructed by forming an impurity diffusion region whose conductivity type is an opposite conductivity type to the semiconductor substrate in a surface layer portion of the semiconductor substrate, and the impurity diffusion region and a lower surface of the semiconductor substrate act as the connection portion, and
  the contact hole is formed in the insulating layer on both surface sides of the semiconductor substrate respectively.

* * * * *